(12) United States Patent  
Esconjauregui et al.

(10) Patent No.: US 8,470,709 B2  
(45) Date of Patent: Jun. 25, 2013

(54) FORMATION OF METAL-CONTAINING NANO-PARTICLES FOR USE AS CATALYSTS FOR CARBON NANOTUBE SYNTHESIS

(75) Inventors: Santiago Cruz Esconjauregui, Leuven (BE); Caroline Whelan, Hanret (IE); Karen Maex, Herent (BE)

(73) Assignees: IMEC, Leuven (BE); Katholieke Universitet Leuven, K.U. Leuven R&D, Leuven (BE)

( * ) Notice: Subject to any disclaimer, the term of this patent is extended or adjusted under 35 U.S.C. 154(b) by 895 days.

(21) Appl. No.: 11/993,828

(22) PCT Filed: Jun. 16, 2006

(86) PCT No.: PCT/EP2006/005784  
§ 371 (c)(1),  
(2), (4) Date: Jun. 28, 2010

(87) PCT Pub. No.: WO2006/133949  
PCT Pub. Date: Dec. 21, 2006

(65) Prior Publication Data  
US 2010/0285656 A1    Nov. 11, 2010

Related U.S. Application Data

(60) Provisional application No. 60/691,828, filed on Jun. 17, 2005.

(51) Int. Cl.  
*H01L 21/44* (2006.01)

(52) U.S. Cl.  
USPC .......................................... 438/666; 438/674

(58) Field of Classification Search  
USPC .......................... 438/666, 674, 677, 682, 683  
See application file for complete search history.

(56) References Cited

U.S. PATENT DOCUMENTS

2005/0026531 A1 *    2/2005    Ohnuma ........................ 445/50

OTHER PUBLICATIONS

De Los Arcos et al., Appl. Phys. Lett. 80(13) (2002) 2383.  
Teo et al., Appl. Phys. Lett. 79 (2001) 1534.  
Chhowalla et al., J. Appl. Phys. 90 (2001) 5308.

* cited by examiner

*Primary Examiner* — Kevin M Picardat  
(74) *Attorney, Agent, or Firm* — Knobbe, Martens, Olson & Bear, LLP

(57) ABSTRACT

The present invention relates to a method for forming metal-silicide catalyst nanoparticles with controllable diameter. The method according to embodiments of the invention leads to the formation of 'active' metal-suicide catalyst nanoparticles, with which is meant that they are suitable to be used as a catalyst in carbon nanotube growth. The nano-particles are formed on the surface of a substrate or in case the substrate is a porous substrate within the surface of the inner pores of a substrate. The metal-silicide nanoparticles can be Co-silicide, Ni-silicide or Fe-silicide particles. The present invention relates also to a method to form carbon nanotubes (CNT) on metal-silicide nanoparticles, the metal-silicide containing particles hereby acting as catalyst during the growth process, e.g. during the chemical vapor deposition (CVD) process. Starting from very defined metal-containing nanoparticles as catalysts, the diameter of grown CNT can be well controlled and a homogeneous set of CNT will be obtained.

20 Claims, 24 Drawing Sheets

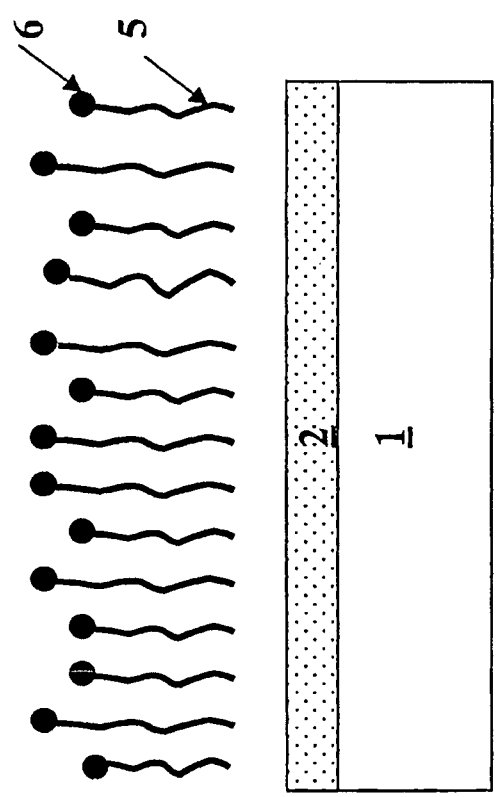

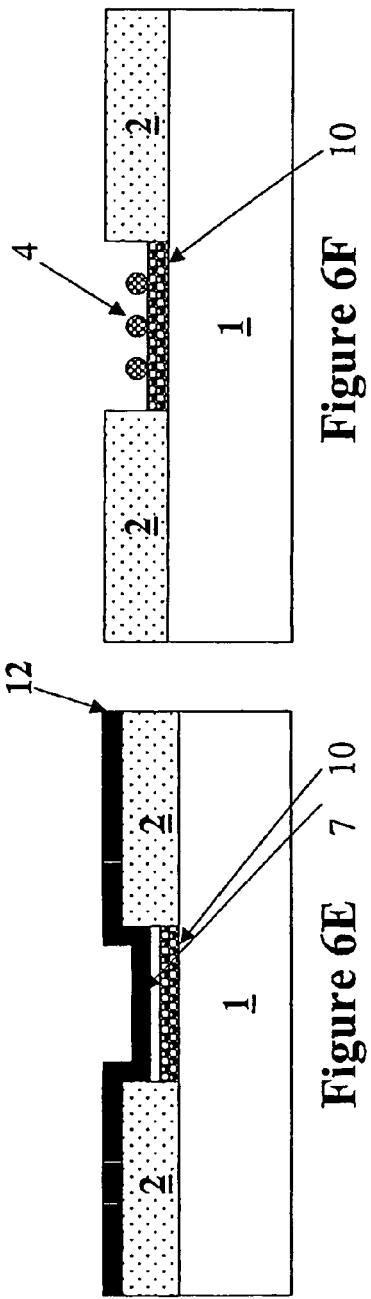

Figure 12
TEM images of grown CNT.
- Ni nano-particles on $SiO_2$
- Co nano-particles on $SiO_2$
- Ni-silicide nano-particles on Si.
- Co silicide nano-particles on Si.
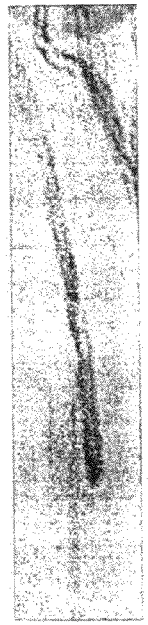
Figure 12A
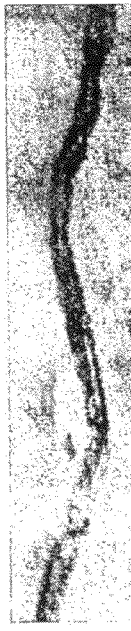
Figure 12B
Figure 12C
Figure 12D Increasing Substrate Preparation / CNT Growth

600°C — 900°C

US 8,470,709 B2

FORMATION OF METAL-CONTAINING NANO-PARTICLES FOR USE AS CATALYSTS FOR CARBON NANOTUBE SYNTHESIS

CROSS-REFERENCE TO RELATED APPLICATIONS

This application is the national phase under 35 U.S.C. §371 of prior PCT International Application No. PCT/EP2006/005784 which has an International filing date of Jun. 16, 2006, which designated the United States of America, and which claims the benefit of U.S. Provisional Application No. 60/691,828 filed Jun. 17, 2005.

FIELD OF INVENTION

The present invention is related to the field of carbon nanotube synthesis. More specifically the invention is related to the formation of metal-containing nanoparticles suitable for being used as a catalyst in carbon nanotube growth.

BACKGROUND

Carbon nanotubes (CNT) in general exhibit exceptional electronic and mechanical properties. Therefore, carbon nanotubes are expected to find a big diversity of industrial applications. One of these applications could be the use as both passive and active components in nano-electronics. A lack of understanding of CNT growth mechanisms, however, presents a significant challenge to the realization of such applications. One of the key issues in these growth mechanisms is the formation of catalyst particles (also referred to in this application as nanoparticles) with uniform and controllable diameter to be used in e.g. catalyst mediated chemical vapor deposition processes for CNT growth. Control of the diameter size and uniformity of catalyst nanoparticles is very critical to obtain uniform CNT with controllable diameter.

On the other hand the use of CNT in e.g. electronic applications implies, in some cases, the use of pristine Si as substrate. That is, depositing a catalyst and growing the CNT, directly on Si. However, the associated temperature of typical CNT growth processes reported so far in the state of the art produce a reaction between the metallic catalyst, which may typically be Fe, Co or Ni, and the Si substrate. Thus, the as-prepared catalyst nanoparticles change from pure metal to metal silicide. Several such CNT growth studies have been reported and the catalytic activity of these metal silicides is still under debate. It is not yet clear why these nanoparticles are frequently reported as being inactive, while they have been demonstrated to be active as pure metal. This raises the question of whether or not metal silicide blocks CNT growth.

One of the first reports (Appl Phys. Lett. 77 (2000) 2767) involved sputtering a thin layer of metal catalyst, in the example given a Co layer, onto a Si(100) substrate. Cobalt silicide formation was observed at the Co—Si interface at 825° C. indicating that the cobalt reacts with the silicon during the process.

In "Influence of iron-silicon interaction on the growth of carbon nanotubes produced by chemical vapor deposition", Appl. Phys. Lett. 80(13), (2002), page 2383, T. de los Arcos et al. described that undesired interaction of the metallic catalyst with the silicon substrate, hereby forming metal silicide, could deteriorate the catalytic efficiency of the particles formed for CNT growth. It was shown that, after heating up to 850° C., a silicon substrate comprising a thin iron layer was turned into a silicon substrate having iron silicide particles on top. Subsequent CNT growth using the silicide particles as a catalyst lead to a low density of CNTs on the substrate compared to CNTs grown on a substrate having a barrier layer in between the silicon and the metallic layer to form catalyst, in the example given iron, particles. Furthermore, CNT growth using the iron silicide particles as a catalyst was much slower than when the iron particles formed on the barrier layer were used as a catalyst. Therefore, it was concluded that formation of silicides at the metal/silicon substrate interface should be avoided in order not to decrease the catalyst activity of the formed catalyst particles and thus that metal-silicide particles are not suitable as a catalyst in CNT growth.

In the case of Ni (Appl. Phys. Lett. 79 (2001) 1534), it is described to use a diffusion barrier between the underlying Si substrate and the metal for catalysis of CNT growth. This sample configuration was reported to maintain "active" Ni particles for CNT nucleation and growth by explicitly preventing the formation of Ni-Silicides above 300° C. However, no direct evidence of "catalyst inactivity" in the absence of the diffusion barrier was presented or cited. The same research group later reported the occurrence of silicidation when thin films of Ni and Co were deposited onto three different Si substrates: untreated Si with a thin native oxide, pristine Si and Si with 50 nm of $SiO_2$ (J. Appl. Phys. 90 (2001) 5308). Due to silicidation, no islands were found after annealing at 750° C. in the case of samples where Ni was deposited on untreated Si or Si with native oxide. In contrast, Ni nanoparticles were identified following similar annealing of the Ni deposited on $SiO_2$. Further, on the latter it was possible to grow CNT. Thus, it was concluded that a barrier layer such as $SiO_2$ is required to prevent silicide formation when Ni is used as catalyst. This work was followed by several others claiming the need for a barrier between Ni and a Si substrate.

Overall, similar results but varying conclusions have been shown for catalyst systems combining metals and Si substrates that potentially form metal silicide. On the one hand, CNT growth is catalyzed by these metal compound nanoparticles. On the other hand, the absence of growth has been reported in some systems under almost identical sample preparation and growth conditions (see above).

AIM OF THE INVENTION

It is an aim of the present invention to provide metal-containing particles, e.g. metal-silicide particles or pure metal particles, suitable to be used as catalyst particles in carbon nanotubes (CNT) growth.

An advantage of the present invention is to provide a method for the growth of CNT using the method for forming metal-containing particles, e.g. metal-silicide particles or pure metal particles, according to the present invention in which the diameter size of catalyst nanoparticles can be controlled such that growth of CNTs with controllable diameter is obtained.

It is a further advantage of the present invention that massive growth of CNT using metal-silicide nanoparticles as catalyst can be obtained.

It is a further advantage of the present invention that (under certain pretreatment and growth conditions) metal-silicide nanoparticles can be obtained which are as catalytically active as pure metal nanoparticles.

SUMMARY OF THE INVENTION

The present invention relates to a method for forming metal-containing catalyst nanoparticles, e.g. metal-silicide nanoparticles or pure metal nanoparticles, with controllable diameter and which form active catalyst nanoparticles, with active catalyst nanoparticles being meant that the formed nanoparticles are suitable to be used as a catalyst for carbon nanotube growth. In other words, "active" is to be understood as being capable of growing/synthesizing a carbon nanotube (no fiber!) onto the formed metal-containing nanoparticles. The growth/creation of a carbon nanotube is a multi-step process of first receiving a carbon source, followed by cracking the C and subsequently growing the carbon nanotube. The initial formation of said metal-containing nanoparticles, e.g. metal-silicide nanoparticles or pure metal nanoparticles, is found to be a key factor in CNT nucleation and subsequent massive growth of the CNT. The metal-containing nanoparticles may be pure metal nanoparticles such as e.g. made of or comprising Ni, Fe or Co or may be metal-silicide nanoparticles such as e.g. made of or comprising Ni-silicide, Fe-silicide or Co-silicide. Most preferred, the metal-containing nanoparticles may be metal-silicide nanoparticles.

In a first aspect of the invention, a method is provided to form metal-silicide nanoparticles having a diameter smaller than 10 nm on a substrate for use as catalyst in carbon nanotube growth. The formed metal-silicide nanoparticles form active catalyst nanoparticles. With active catalyst nanoparticles is meant that the formed nanoparticles are suitable to be used as a catalyst for carbon nanotube growth.

The method comprises the steps of:

Depositing a barrier layer onto the substrate,

Depositing a thin layer of silicon containing material onto the barrier layer, the thin layer of silicon containing material having a thickness between 1 nm and 10 nm, Depositing a thin metal film onto the thin layer of silicon containing material, the thin metal film having a thickness of less than 10 nm, and Annealing the substrate to form metal-silicide nanoparticles, the barrier layer preventing diffusion of the metal-silicide nanoparticles into the substrate.

According to embodiments of the invention, annealing the substrate may be performed at a temperature higher than 500° C. and lower than 800° C.

Preferably, the thickness of the silicon containing layer may be 5 nm.

Preferably, the thickness of the metal film may be between 1 nm and 5 nm. According to embodiments of the invention, the thin metal layer may also be thinner than 1 nm. However, in this case it is possible that a non-continuous metal layer is obtained which leads to a lower yield of carbon nanotubes when subsequently using the formed metal-silicide particles as a catalyst in the carbon nanotube growth.

According to another aspect of the invention, a method is provided to form metal-silicide nanoparticles having a diameter smaller than 10 nm on a silicon containing substrate for use as catalyst in CNT growth, the method comprising the steps of:

Depositing a thin metal film onto said substrate, the thin metal film having a thickness lower than 10 nm, and Annealing said substrate to form metal-silicide nanoparticles, annealing being performed at a temperature at which no diffusion of the metal-silicide nanoparticles in the substrate occurs.

The temperature at which annealing is performed depends on the thickness of the metal layer and on the metal used. Preferably, annealing may be performed at a temperature lower than 700° C.

With the method according to this embodiment of the invention it is possible to form active metal-silicide catalyst nanoparticles. With active metal-silicide catalyst nanoparticles is meant that they are suitable to be used as a catalyst for carbon nanotube growth Preferably, the metal film may have a thickness between 1 nm and 5 nm. According to embodiments of the invention, the thin metal layer may also be thinner than 1 nm. However, in this case it is possible that a non-continuous metal layer is obtained which leads to a lower yield of carbon nanotubes when subsequently using the formed metal-silicide particles as a catalyst in the carbon nanotube growth.

Independent of which method of manufacture is used, preferably said nanoparticles are formed on the surface of the substrate such as e.g. a semiconductor, silicon, germanium or GaAs substrate, or in case the substrate is a porous substrate, such as e.g. a zeolite, within the surface of the inner pores of said porous substrate. Said metal-containing nanoparticles can be metal particles such as Co, Ni and Fe or metal-silicide containing nanoparticles such as Co-silicide, Ni-silicide or Fe-silicide.

The present invention also provides a method for forming pure metal nanoparticles to be used as a catalyst.

The method to form pure metal nanoparticles or metal-silicide nanoparticles according to the present invention comprises at least the step of depositing a thin layer of metal onto or partly within a substrate followed by an anneal step at a temperature lower than 700° C. Said thin layer of metal is situated on top of said substrate. The thin layer of metal may comprise one or more metals.

In case pure metal nanoparticles need to be formed on a substrate, such as e.g. a semiconductor substrate such as a silicon substrate, a silicon wafer, a germanium or GaAs substrate, etc., said substrate preferably comprises a barrier layer, said barrier layer being deposited before depositing the metal layer. Said barrier layer is needed to prevent reaction of the metal with the substrate underneath. Said barrier layer can be e.g. a SiO$_2$ layer or any other layer that prevents reaction of the metal with the substrate underneath, e.g. in case of a silicon substrate the barrier layer may prevent the formation of metal silicide. In case metal-silicide nanoparticles need to be formed on a silicon substrate such as a silicon wafer, the annealing temperature applied during catalyst pre-treatment and/or during CNT growth temperature as well as the thickness of the deposited metal film is a key parameter to control the catalytic activity of the metal-silicide containing nanoparticles and to prevent diffusion of said metal-silicide nanoparticles into the silicon substrate. Starting from said metal-silicide containing nanoparticles which are formed directly onto a silicon substrate it is possible to obtain base growth of CNT which gives strong substrate adhesion.

In case metal-silicide nanoparticles need to be formed which are less sensitive to CNT growth temperature and lead towards tip growth instead of base growth as described above, a barrier layer needs to be deposited onto the substrate, e.g. semiconductor, silicon, germanium or GaAs substrate. Onto said barrier layer a thin silicon containing layer with a thickness between 1 nm and 10 nm and preferably with a thickness of 5 nm is deposited followed by the deposition of a metal layer. Said barrier layer is needed to prevent migration of the metal-silicide nanoparticles into the substrate, e.g. semiconductor, silicon, germanium or GaAs substrate. The barrier layer can be e.g. an oxide layer such as a SiO$_2$ layer, a metal nitride such as TaN, HfN or TiN, or any other layer that prevents reaction with the underlying substrate, e.g. silicidation with a Si substrate underneath and/or migration of the metal-silicide into the substrate.

The thin layer of metal used to form metal or metal-silicide nanoparticles can be a uniformly deposited thin layer of metal, e.g. a metal layer deposited by commonly used techniques, e.g. sputter techniques such as PVD (Physical Vapor Deposition). Preferably the thickness of said metal layer is less than 10 nm, more preferably the thickness of the layer is between 1 nm and 5 nm. According to embodiments of the invention, the thin metal layer may also be thinner than 1 nm. However, in this case it is possible that a non-continuous metal layer is obtained which leads to a lower yield of carbon nanotubes when subsequently using the formed metal-silicide particles as a catalyst in the carbon nanotube growth. Said thin layer of metal can also be a non-uniform sub-atomic layer deposited by e.g. ALD (Atomic Layer Deposition). Alternatively said thin layer of metal can also be a non-uniformly deposited sub-atomic metal layer deposited by electro-deposition or electroless deposition.

The step of forming metal-containing nanoparticles, e.g. pure metal nanoparticles or metal-silicide particles, is done by annealing said thin film of metal. To control the size, more particularly to control the diameter of said nanoparticles the temperature and time duration of the annealing step are critical as well as the thickness of the metal film. The optimal temperature and time to create said metal-containing nanoparticles, e.g. pure metal nanoparticles or metal-silicide particles, is dependent on the type of metal, the thickness of the deposited metal layer and the substrate onto which the nanoparticles need to be formed. Preferred temperature ranges for annealing are, in case a barrier layer is deposited on the substrate before the silicon layer and/or the metal layer are deposited, between 500° C. and 900° C., or between 500° C. and 800° C. or between 600° C. and 900° C. which can be further optimized. Gases such as nitrogen and/or hydrogen can be used as ambient gases in the reactor for anneal.

Most preferred metal-containing particles, e.g. pure metal nanoparticles or metal-silicide particles, may be mainly formed onto the surface of a substrate. In case the substrate is e.g. a porous material, said metal-containing nanoparticles, e.g. pure metal nanoparticles or metal-silicide particles, may also be formed onto the surface of the inner pores of said material when this is porous. Using a substrate having pores (porous materials such as zeolites and porous low-k materials commonly used in semiconductor processing) can increase the amount of metal-containing nanoparticles, e.g. pure metal nanoparticles or metal-silicide particles, on or in the substrate and subsequently can increase the amount of formed CNT significantly.

To form metal-silicide nanoparticles, also referred to as metal-silicide catalyst particles, the substrate may preferably be a Si surface, most preferred a Si (100) surface. A Si wafer (which can further comprise patterned structures) commonly used in semi-conductor processing can be used as substrate to grow/deposit said metal-silicide nanoparticles.

In case a barrier layer, e.g. $SiO_2$ barrier layer, needs to be formed, said barrier layer can be created by means of a thermal anneal, or by depositing a layer of the material of the barrier layer, e.g. a $SiO_2$ layer. The thickness of said barrier layer may be such that it prevents reaction with the substrate underneath, e.g. to avoid silicidation because of reaction of the metal with a silicon substrate, the barrier layer may preferably have a thickness in the range of 50 nm up to 100 nm.

Also disclosed in the present invention is the formation and/or growth of CNTs on metal-containing nanoparticles, e.g. pure metal nanoparticles or metal-silicide nanoparticles. The method may preferably use a gaseous carbon source such as $C_2H_4$, $CH_4$, . . . , and gases such as $N_2$ and/or $H_2$ as assistant gases for the growth of CNTs. The optimal growth temperature may be dependent on the nature of the catalyst nanoparticles. In case metal-silicide catalyst nanoparticles are formed directly onto a silicon substrate, the growth temperature may preferably be limited to 700° C., more preferably to 600° C. to avoid diffusion of the silicide into the substrate. In case metal-silicide or pure metal catalyst nanoparticles are formed using a barrier layer in between said nanoparticles and the substrate, the growth temperature can be much higher and may preferably be in the range of 500° C. up to 900° C., or 500° C. up to 800° C. or 600° C. up to 900° C., temperatures higher than 900° C. need to be avoided. Any method of the present invention to create metal-silicide nanoparticles and subsequently CNT synthesis can be applied to the synthesis of CNT in bulk. To obtain bulk CNT synthesis said grown CNT can be easily removed from the substrate.

The present invention thus also provides a method for growing carbon nanotubes (CNTs) on a substrate having metal-silicide nanoparticles made using any of the methods according to the present invention, the method comprising:

growing carbon nanotubes using the metal-silicide nanoparticles as a catalyst.

The method of the invention to create metal-containing nanoparticles, e.g. pure metal nanoparticles or metal-silicide nanoparticles, and subsequently CNT synthesis or growth can be applied in several industrial applications such as the use in the manufacture of semiconductor devices. Metal-containing nanoparticles, e.g. pure metal nanoparticles or metal-silicide nanoparticles, can be formed in patterned structures and CNTs can be grown out of these catalyst nanoparticles and can be used as active or passive components in a nano-electronic device.

The present invention furthermore provides a semiconductor device comprising:

a substrate, e.g. a semiconductor, e.g. Si, Ge or GaAs substrate, a barrier layer on the substrate, uniformly dispersed metal-silicide nanoparticles situated on the barrier layer and having a diameter smaller than 10 nm, the nanoparticles to be used as catalyst to obtain massive growth of CNT.

The barrier layer may have a thickness of between 50 nm and 100 nm

BRIEF DESCRIPTION OF THE DRAWINGS

All drawings are intended to illustrate some aspects and embodiments of the present invention. Not all alternatives and options are shown and therefore the invention is not limited to the content of the given drawings. Like numerals are employed to reference like parts in the different figures. The figures show embodiments of the present invention.

FIGS. 2A to 2E illustrate the processing method for forming pure metal nanoparticles on a $SiO_2$-substrate. Said metal nanoparticles can be metals such as Ni, Co or Fe.

FIGS. 6A to 6G illustrate the processing method for growing CNT in a patterned structure by first forming a continuous metal-silicide containing layer (e.g. Co-Silicide layer) and subsequently forming metal-silicide containing nanoparticles (e.g. Ni-Silicide particles) in said patterned structure.

FIG. 12 shows TEM (Transmission Electron Microscopy) images of grown CNT on Ni nanoparticles on a $SiO_2$ substrate (FIG. 12A), on Co nanoparticles on a $SiO_2$ substrate (FIG. 12B), Ni-silicide nanoparticles on a Si substrate (FIG. 12C) and on Co-silicide nanoparticles on a Si substrate (FIG. 12D).

DETAILED DESCRIPTION OF THE INVENTION

Figure 1A:
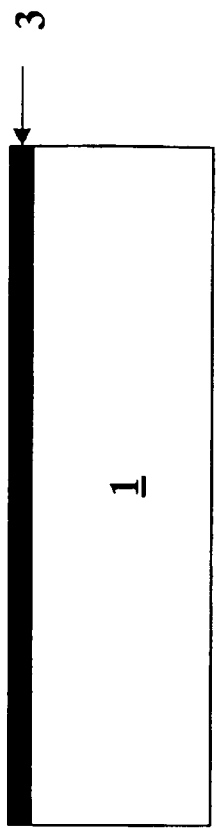
FIGS. 1A to 1E illustrate the processing method for forming metal-silicide containing nanoparticles on a Si-substrate. Said metal-silicide containing particles can be e.g. Ni-silicide, Co-silicide or Fe-silicide.

The following description illustrates a method for forming metal containing nanoparticles, e.g. pure metal nanoparticles or metal-silicide nanoparticles, on a substrate or partly into a substrate. Preferably said metal-containing nanoparticles, e.g. pure metal nanoparticles or metal-silicide nanoparticles, are optimized for use as a catalyst for subsequent carbon nano-tube growth on a or the substrate. Also the use of said metal-containing nanoparticles, e.g. pure metal nanoparticles or metal-silicide nanoparticles, for the synthesis of CNT in bulk as well as the growth of CNT out of these metal-containing nanoparticles, e.g. pure metal nanoparticles or metal-silicide nanoparticles, for semiconductor applications will be described below.

The invention is described by means of a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In the further description, the invention will be described by means of a silicon substrate. It has to be understood that is not limiting the invention and that other substrates such as e.g. semiconductor, germanium or GaAs substrates may also be used according to the present invention.

Furthermore, the terms "base growth" or "bottom up growth" of CNT as used in this application refer to CNT growth having the catalyst nanoparticle attached to the substrate. The terms "tip growth" or "top down growth" of CNT as used in this application refer to CNT growth having the CNT attached to the surface and the nanoparticle being on top of the CNT.

Furthermore, the terms "pure metal" nanoparticles refers to nanoparticles made of pure metal. The term "metal-silicide" nanoparticles refers to nanoparticles made of metal-silicides such as Ni-silicide, Co-silicide, Fe-silicide, . . . . The term "metal-containing" nanoparticles refers to both metal nanoparticles and metal-silicide nanoparticles.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

I. Formation of Metal and Metal-Silicide Nanoparticles for Use as Catalyst in CNT Growth A method is disclosed for forming metal-containing, e.g. pure metal nanoparticles or metal-silicide nanoparticles, catalyst nanoparticles with controllable diameter. More particularly, the invention discloses a method to form 'active' metal containing nanoparticles, e.g. pure metal nanoparticles or metal-silicide nanoparticles, with 'active' metal-containing nanoparticles being meant that they are suitable for being used as catalyst particles in CNT growth which will give rise to massive growth of CNT. Said massive growth of CNT preferably occurs when the catalyst is present in the form of nanoparticles. As will be described in detail below, the effectiveness of said metal-containing nanoparticles, e.g. pure metal nanoparticles or metal-silicide nanoparticles, as a catalyst for CNT nucleation and growth is greatly dependent on the deposited metal film thickness, on the substrate, and on the annealing temperature applied during catalyst pre-treatment and/or during CNT growth. The particle size distribution of said metal-containing, e.g. pure metal nanoparticles or metal-silicide nanoparticles, catalyst nanoparticles needs to be very well controlled because this has an important impact on the CNT diameter dispersion. The metallic dispersion, which is a measurement of the density of the active phase is also related to the CNT yield.

Figure 1C:
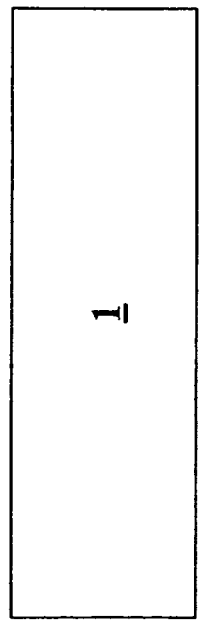
Figure 1B:
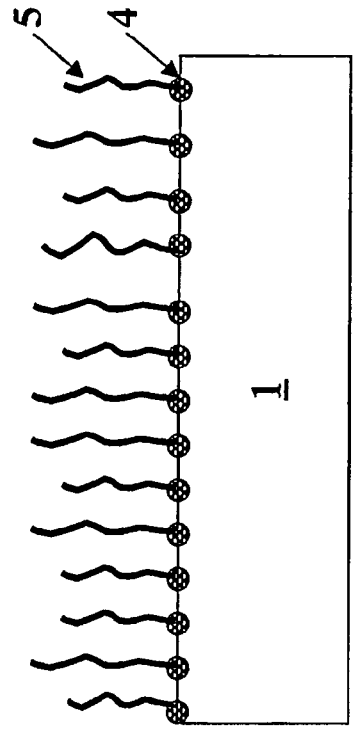

According to an embodiment of the present invention, metal-silicide nanoparticles may be formed on a silicon (Si) substrate. For catalyst metals such as Ni, Co and Fe, it is known that metal-silicide formation, accompanied by changes in both topography and composition, occurs upon annealing above 250° C. when the metal is in contact with Si, e.g. a Si substrate or layer. FIGS. 1A to 1E illustrate the processing method for forming metal-silicide containing nanoparticles on a Silicon containing substrate. Said metal-silicide containing particles can be e.g. Ni-silicide, Co-silicide or Fe-silicide. The method preferably starts on a Si(100) substrate 1 such as a Si wafer (see FIG. 1A). A thin layer or film of metal 3 such as, for example, Co, Fe or Ni is deposited onto the surface of said substrate 1 (see FIG. 1B). Said thin layer of metal 3 can be a uniform deposited thin layer of metal e.g. a metal layer deposited by commonly used sputter techniques such as PVD (Physical Vapor Deposition) or alternatively by ECD (Electrochemical Deposition). Preferably the thickness of said layer 3 is less than 10 nm and more preferred is a thickness between 1 nm and 5 nm. According to embodiments of the invention, the thin metal layer 3 may also be thinner than 1 nm. However, in this case it is possible that a non-continuous metal layer is obtained which leads to a lower yield of carbon nanotubes when subsequently using the formed metal-silicide particles 4 as a catalyst in the carbon nanotube growth. Said thin layer of metal 3 can also be a non-uniform sub-atomic layer deposited by e.g. ALD (Atomic Layer Deposition). Subsequently an anneal step (heating) is performed to form metal-silicide nanoparticles 4. FIG. 1C illustrates the formation of metal-silicide nanoparticles 4 with a well controlled diameter. To control the size, more particularly the diameter, of said nanoparticles 4 the thickness of the deposited metal film 3 as well as the temperature and time duration of the anneal step are critical. The optimal temperature and time to create said metal-silicide containing nanoparticles 4 is dependent on the type of metal and the thickness of the deposited thin metal layer 3. The temperature at which annealing is performed depends on the thickness of the metal layer and on the metal used. Preferred temperature ranges for annealing are between 500° C. and 800° C. which can be further optimized to get massive growth of CNT as described below. Preferred anneal temperature ranges are summarized in FIG. 7A for a 1 nm and 5 nm thick deposited Ni and Co film. At too high anneal temperatures, e.g. above 800° C., the metal-silicide nanoparticles can sinter, hereby forming larger particles and blocks or clusters of nanoparticles, which tend to be oriented in the directions of the Si crystal (diffusion into the substrate). Annealing at too low temperatures, e.g. below 500° C., lead to a continuous metal-silicide film and no break up of the film into nanoparticles 4 occurs. The temperature at which annealing is performed depends on the thickness of the metal layer and on the metal used. Preferably, an annealing temperature of below 700° C. may be used.

Gases such as nitrogen and/or hydrogen can be used as ambient gases in the reactor used for the anneal process. The annealing environment, vacuum and ambient atmospheres, is however found to have no impact on the result of the anneal process. FIGS. 8C and 8D show AFM (Atomic Force Microscopy) roughness analysis results after annealing a 1 nm thick metal film (in the example given Ni and Co) on a Si surface resulting in metal-silicide nanoparticles 4.

Figure 1D:
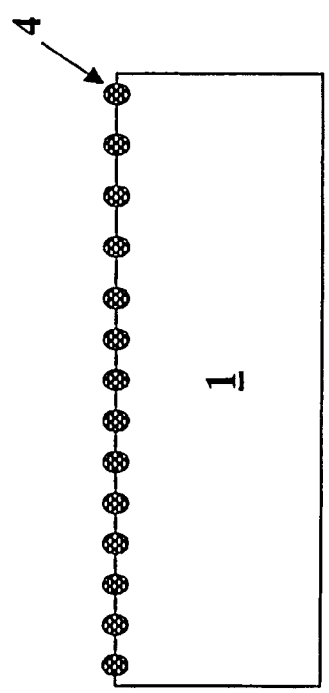
Figure 1E:
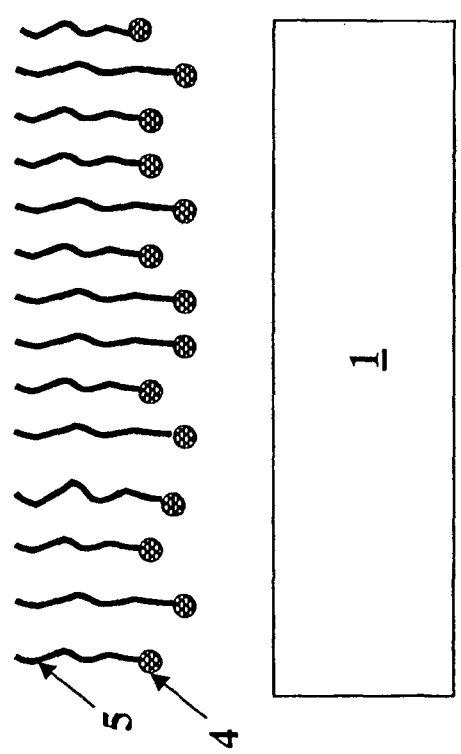
Figure 15:
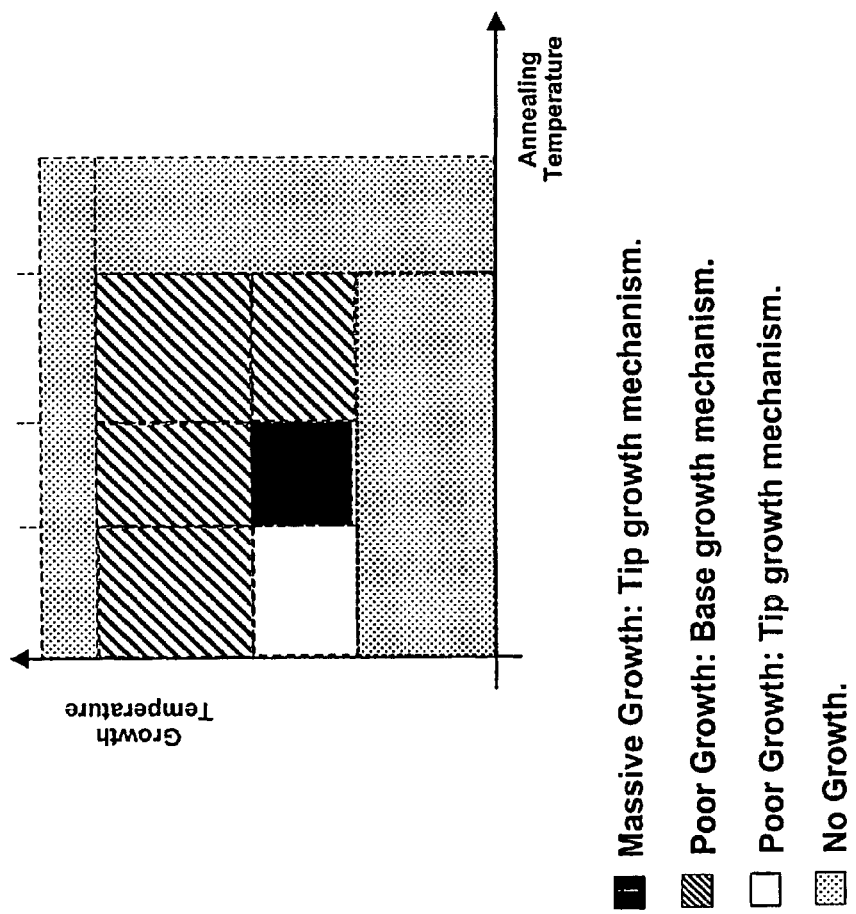
FIG. 15 illustrates another schematic overview of the catalytic properties of metal-silicide nanoparticles formed on a (pristine) Si substrate as a function of the temperature. The optimal (anneal and subsequent CNT growth) temperature is further dependent on the type of metal and the thickness of the deposited metal film.

FIG. 1D illustrates the growth of carbon nanotubes (CNTs) 5 on said metal-silicide nanoparticles 4 and thus using the metal-silicide nanoparticles 4 as a catalyst. To avoid migration of the metal-silicide nanoparticles 4 into the silicon substrate 1 (inhibiting CNT growth), a narrow temperature window is preferably used, meaning that the CNT growth temperature may preferably be below 700° C. and may more preferably be around 600° C. (further dependent on the thickness and type of metal used as set out in the examples). The method may preferably use $C_2H_4$ as a carbon source, gases such as $N_2$ and/or $H_2$ as assistant gases and 600° C. as growth temperature. According to other embodiments, other carbon sources may be used such as $CH_4$. In this case other growth temperatures may apply, as known by a person skilled in the art. For example, using other carbon sources than $C_2H_4$, growth temperatures lower than 500° C. may also be suitable for growing CNTs. FIG. 15 illustrates said narrow process window for metal-silicide nanoparticles 4 formed on a (pristine) Si substrate 4 as a function of the temperature to get massive growth of CNTs 5. The optimal (anneal and subsequent CNT growth) temperature is further dependent on the type of metal and the thickness of the deposited metal film 3. The formation and growth of CNTs can be base growth, or in other words having the catalyst nanoparticle 4 stuck to the substrate 1, or tip growth having the CNT 5 stuck to the substrate 1 (as shown in FIG. 15). The obtained CNTs 5 can be released from the substrate 1 if needed (e.g. for bulk CNT production) as shown in FIG. 1E.

Figure 2A:
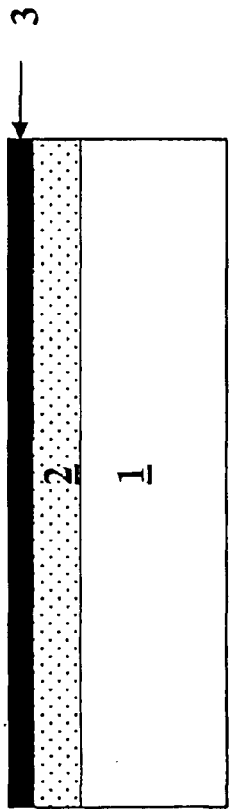
Figure 2B:
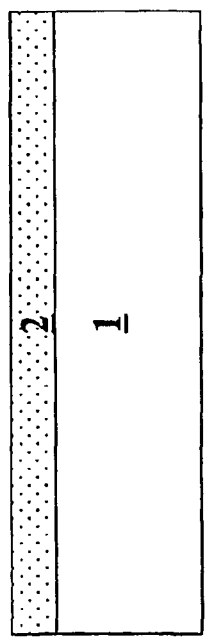
Figure 2C:
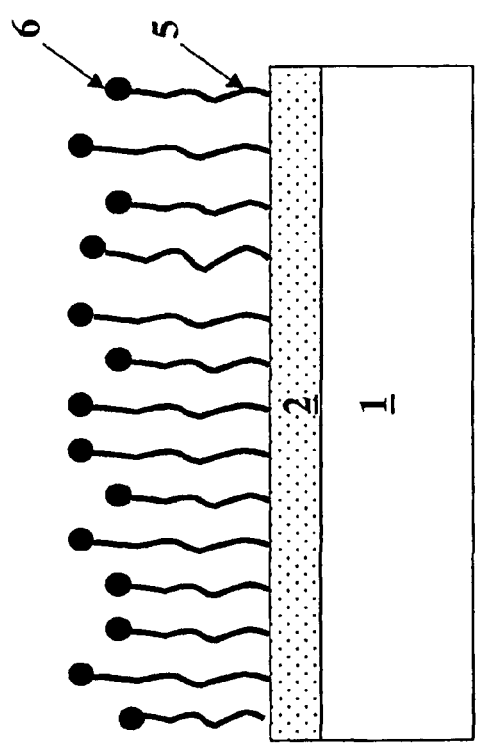
Figure 2D:
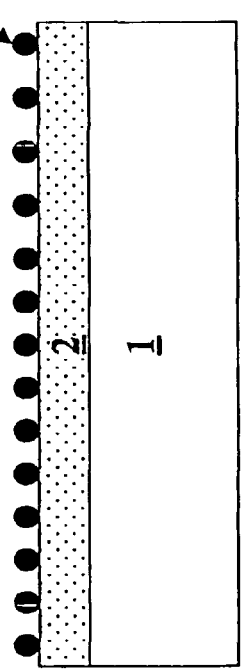
Figure 7A:
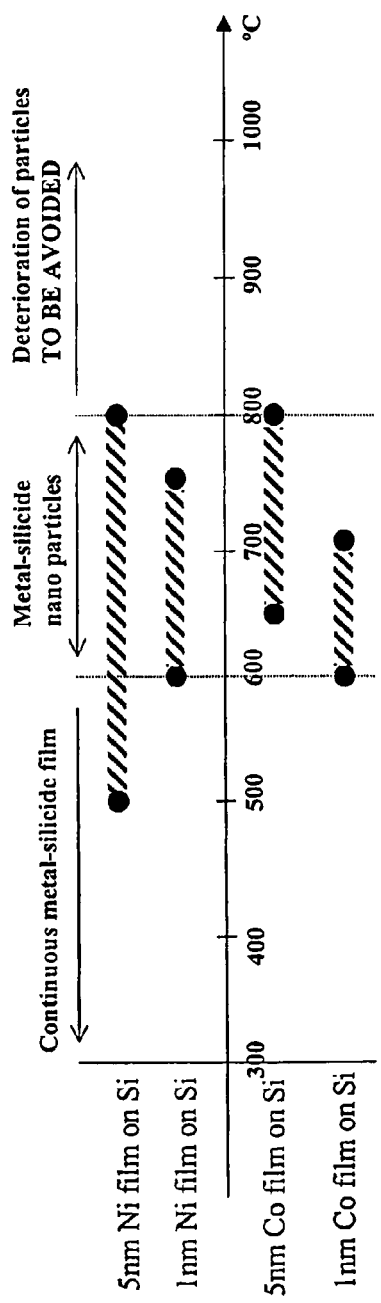
FIG. 7A illustrates the optimal anneal temperatures for achieving metal-silicide nanoparticles on a Si-substrate for a 1 nm thick deposited Ni film, a 5 nm thick deposited Ni film, a 1 nm thick deposited Co film and a 5 nm thick deposited Co film. As it can be seen the optimal anneal temperature (range) to obtain metal-silicide nanoparticles is dependent on the thickness of the deposited metal and the type of metal. Too low temperatures will result in a continuous metal-silicide containing film and too high temperatures will result in deterioration and/or agglomeration of the metal-silicide particles which has to be avoided.
Figure 7B:
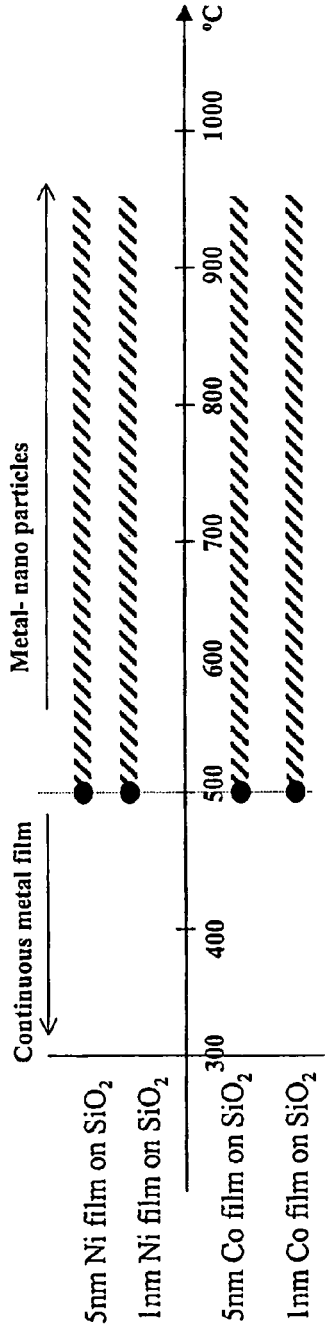
FIG. 7B illustrates the optimal anneal temperatures for achieving pure metal nanoparticles on a $SiO_2$ barrier layer for a 1 nm thick deposited Ni film, a 5 nm thick deposited Ni film, a 1 nm thick deposited Co film and a 5 nm thick deposited Co film.

In another preferred embodiment and shown schematically in FIGS. 2A to 2E, (pure) metal nanoparticles are formed. The method preferably starts on a substrate such as e.g. a Si wafer 1. On said silicon substrate 1, preferably a barrier layer 2 such as a thermal oxide to obtain a $SiO_2$ top layer is deposited (see FIG. 2A). Said barrier layer 2 is needed to prevent silicidation of the metal with the underlying silicon of the substrate 1. Said barrier layer 2 can be e.g. a $SiO_2$ layer or any other layer that prevents silicidation with the Si substrate underneath and/or migration of metal-silicides into the substrate. For example, the barrier layer 2 may also be a metal nitride, such as TaN, HfN or TiN. A thin layer of metal 3 such as Co, Fe or Ni is then deposited onto the barrier layer 2 (see FIG. 2B). The thickness of said thin metal film 3 is preferably lower than 10 nm and more preferred between 1 nm and 5 nm. The thickness of the thin metal film 3 will determine the size of the nanoparticles; a thinner film will lead to smaller particles while their density is increased with respect to thicker films forming larger particles. Subsequently, an anneal step is performed to form the metal nanoparticles 6 (see FIG. 2C). During said anneal step, the metal film 3 becomes discontinuous by breaking into two-dimensional islands. This process is driven by surface tension effects that lower the total energy of the system and reduce film stress caused by the difference in thermal expansion between Si and the metal. FIG. 2C illustrates the formation of metal nanoparticles 6 with a well controlled diameter. The anneal conditions such as time duration and temperature are also here critical to obtain well controlled particle sizes, but are less critical than the process parameters (anneal) to obtain metal-silicide nanoparticles 4 as described in the previous embodiment. Preferred anneal temperatures to form metal nanoparticles 6 are above 500° C. and preferably below 900° C. FIG. 7B illustrates the optimal anneal temperatures for achieving pure metal nanoparticles 6 on a $SiO_2$ barrier layer 2 for a 1 nm deposited Ni film, a 5 nm deposited Ni film, a 1 nm deposited Co film and a 5 nm deposited Co film. The catalytic activity of pure metal nanoparticles 6 remains unchanged independent of the initial film thickness and annealing temperatures. FIG. 2C illustrates the growth of CNTs 5 on the substrate 1 using the pure metal nanoparticles 6 as a catalyst. The method for growing the CNTs 5 may preferably use $C_2H_4$ as a carbon source, gases such as $N_2$ and/or $H_2$ as assistant gases and temperatures between 600° C. and 900° C., preferably between 600° C. and 800° C., as growth temperature. According to other embodiments, other carbon sources may be used such as $CH_4$. In this case other growth temperatures may apply, as known by a person skilled in the art. For example, using other carbon sources than $C_2H_4$, growth temperatures lower than 500° C. may also be suitable for growing CNTs. In general, the diameter of the formed CNTs are consistent with, i.e. are substantially the same as, the diameter of the original pure metal catalyst nanoparticles 6. With decreasing nanoparticle sizes, the CNT diameter becomes smaller, following a one to one relation. Massive growth of CNTs occurs for pure metal nanoparticles 6 up to 800° C. Only morphological effects can be observed. The resulting CNTs are straighter when the growth temperature is increased. As-grown CNTs at 600° C. show much more twisted structures than those grown at 800° C., for instance. Nevertheless, at 900° C. only few nanoparticles 6 can catalyze CNT growth. This effect is attributed to poisoning of the catalyst nanoparticles 6. Because of the high temperature, $C_2H_4$ decomposes faster than carbon diffuses into the pure metal nanoparticles 6. Hence, they become covered with amorphous carbon, which blocks graphite precipitation in the CNT form. FIG. 2D illustrates the growth of CNT 5 on said metal nanoparticles 6 (as described in previous embodiment). The formation and growth of CNTs 5 onto the metal nanoparticles 6 is tip growth or in other words having the CNT 5 stuck to the surface of the substrate 1 (as shown in FIG. 2D). The obtained CNTs 5 can be released from the substrate 1 if needed (e.g. for bulk CNT production) as shown in FIG. 2E.

Figure 3A:
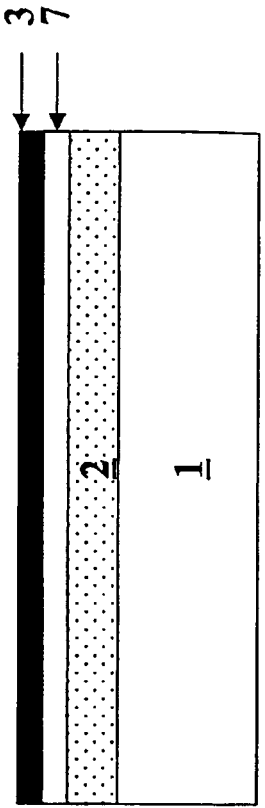
FIGS. 3A to 3E illustrate the processing method for forming metal-silicide containing nanoparticles on a Si-substrate with intermediate barrier-layer (here $SiO_2$).
Figure 3B:
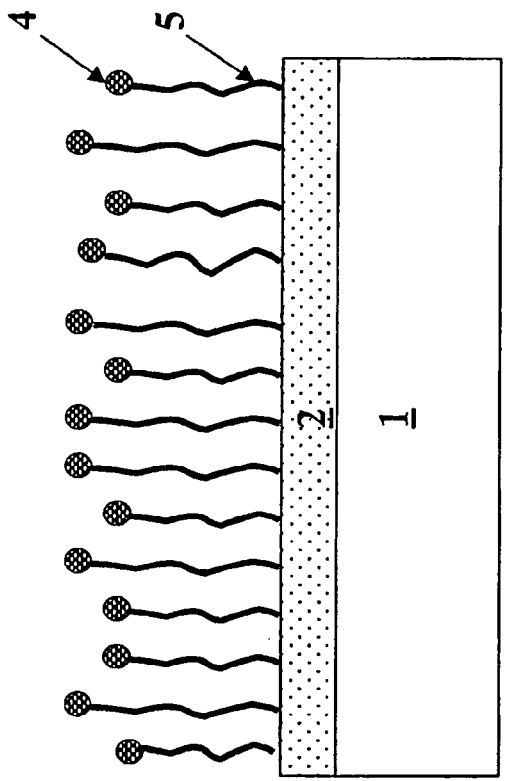
Figure 3C:
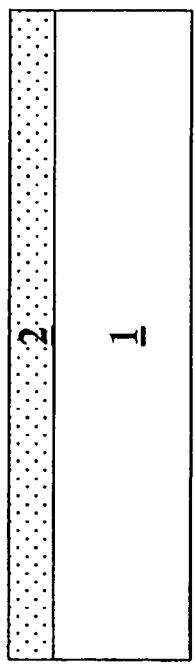
Figure 3D:
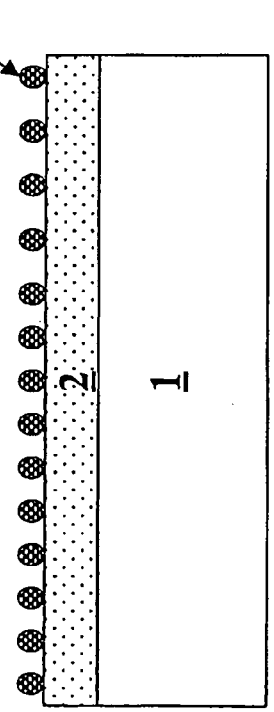
Figure 3E:
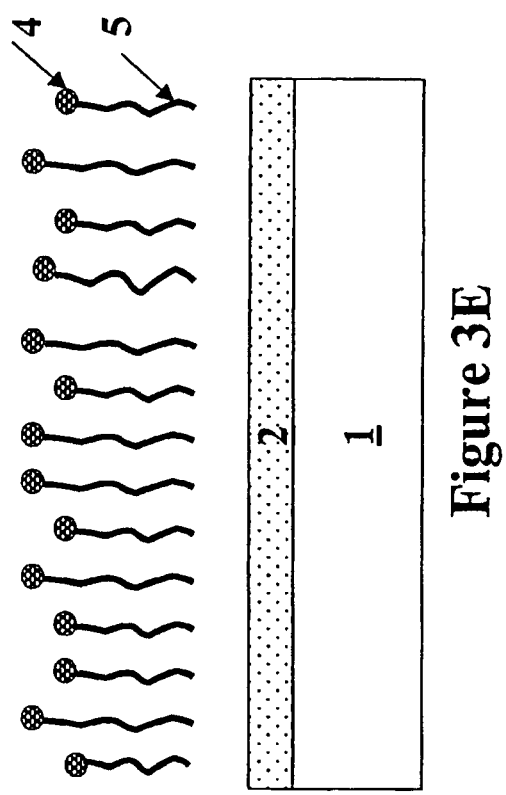
Figure 4A:
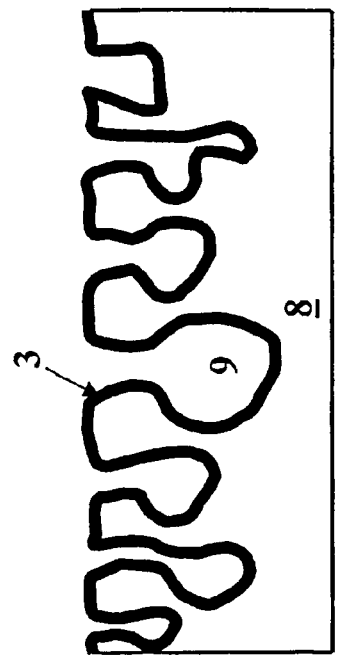
FIGS. 4A to 4D illustrate the processing method for forming metal containing nanoparticles in—or partly on—a porous substrate. The metal containing nanoparticles will be also formed on the inner surface of the pores situated within the substrate, which increases the amount of nanoparticles and subsequently formed CNT significantly.
Figure 4B:
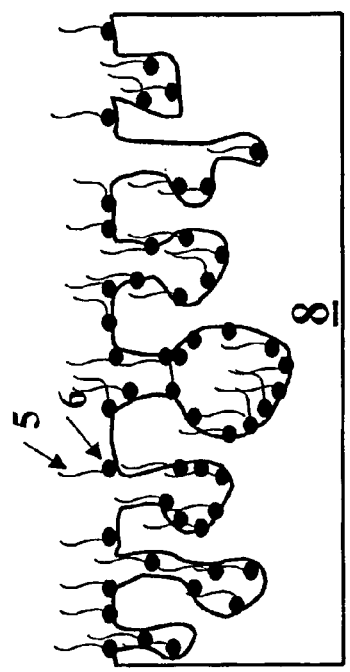
Figure 4C:
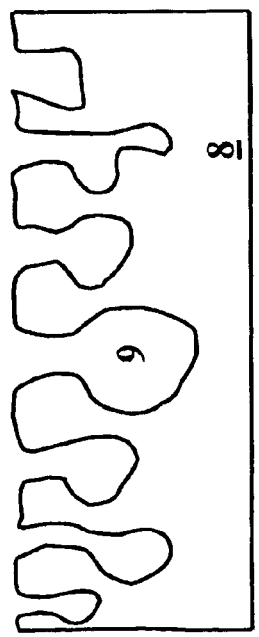
Figure 4D:
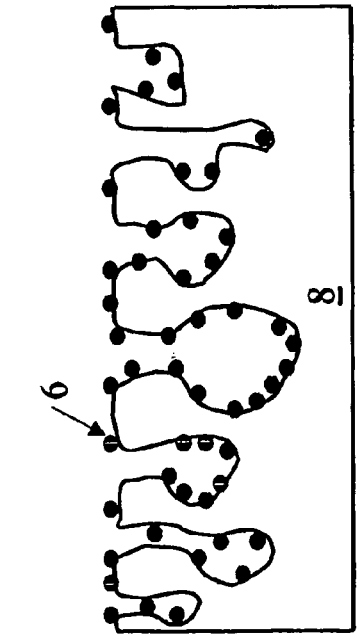

In another alternative and also preferred embodiment (shown in FIGS. 3A to 3E) metal-silicide nanoparticles are formed using an intermediate (chemical) barrier layer 2 such as $SiO_2$ which is deposited onto the substrate 1. Said barrier layer 2 can be e.g. a $SiO_2$ layer, a metal nitride layer such as e.g. a TaN, HfN or TiN layer, or can be any other layer that prevents reaction of the metal layer 3 with the underlying substrate 1, e.g. silicidation with the Si substrate underneath and/or migration of metal-silicides into the substrate. The method preferably starts on a substrate such as e.g. a Si wafer 1 on which, in the example given, a thermal oxide is grown to obtain a $SiO_2$ layer 2 acting as a chemical barrier layer 2 (see FIG. 3A). A thin layer of Si 7 and subsequently a thin layer of metal 3 are then deposited onto said substrate 1 (shown in FIG. 3B). The thin layer of Si 7 may preferably have a thickness of between 1 nm and 10 nm and may more preferably have a thickness of around 5 nm. The thin metal layer 3 may comprise any suitable metal to form a silicide upon reaction with the thin layer of Si 7, such as for example, Ni, Co or Fe. It appears that the thickness of the layer of Si 7 is important in order to obtain metal-silicide nanoparticles 4 with controlled diameter. Preferably, the thickness of the layer of Si 7 is in the same order of thickness as the thin metal layer 3. An anneal step is then performed to form the metal-silicide nanoparticles 4 onto the $SiO_2$ barrier layer 2. During the anneal step, the temperature may be between 500° C. and 900° C., or between 600° C. and 900° C. or between 500° C. and 800° C. FIG. 3C illustrates the formation of metal-silicide nanoparticles 4 with a well controlled diameter. FIG. 3D illustrates the growth of CNTs 5 on said metal-silicide nanoparticles 4. The growth of CNTs 5 may be performed similar to the methods as described in previous embodiments. The formation and growth of CNTs 5 is tip growth as illustrated in FIG. 3D. This is because, contrary to growth of CNTs 5 using metal-silicide nanoparticles 4 directly formed on the silicon substrate 1, the nanoparticles 4 are now not embedded in the substrate 1 because a barrier layer 2 is provided between the nanoparticles 4 and the substrate 1. The barrier layer 2 does not react with metal-silicide nanoparticles 4 through which the nanoparticles 4 are located on top of the barrier layer 2 and are not embedded into the barrier layer 2 as is the case when metal-silicide particles 4 are formed form a metal layer 3 directly deposited onto the silicon substrate 1. The metal-silicide nanoparticles 4 are thus not well attached to the barrier layer 2 which promotes tip growth. The obtained CNTs 5 can be released from the substrate 1 if needed (e.g. for bulk CNT production) as shown in FIG. 3E.

Metal-silicide nanoparticles 4 formed on a substrate 1 comprising a barrier layer 2 (such as $SiO_2$) through which diffusion into the substrate 1 is not possible, remain catalytically active at high temperatures. After annealing, said metal-silicide nanoparticles 4 can be subjected to high (growth) temperatures ranging between 600 and 900° C. and resulting in massive growth of CNTs 5. Since a barrier layer 2, e.g. $SiO_2$, was deposited on the substrate 1, metal-silicide nanoparticles 2 cannot agglomerate and/or diffuse in the substrate 1. This way, metal-silicide nanoparticles 4 remain catalytically active at high temperatures while in the case where they were formed directly onto the Si substrate 1 they were not catalytically active at high temperatures.

In still another preferred embodiment, the substrate may be formed from a porous material and thus may be a porous substrate 8. Examples of said porous materials are zeolites and porous low-k materials commonly used in semiconductor processing. Using porous material or, in other words a substrate 8 having inner pores, makes it possible to deposit metal layers 3 not only on the upper part of the substrate 8 but also within the inner pores 9 of the substrate 8, which increases the "active" surface area needed to create nanoparticles onto significantly. As a result the amount of CNTs 5 created by this method will increase. The processing method is schematically shown in FIGS. 4A to 4D. First, a porous substrate 8 is provided (see FIG. 4A). A thin film of metal 3 (continuous or non continuous) is then deposited on the surface of the porous substrate 8 and on the surface of the inner pores 9 of the porous substrate 8 (see FIG. 4B). After annealing (similar to the methods as described in previous embodiment to create pure metal nanoparticles 6 or metal-silicide nanoparticles 4) a lot of catalyst nanoparticles, in the example given pure metal nanoparticles 6, may be created (see FIG. 4C). These catalyst nanoparticles 6 will be used to grow CNTs 5 (see FIG. 4D). To release these CNTs 5 from the porous substrate 8 for e.g. bulk production of CNTs 5, a simple release process such as chemical dissolution of the porous substrate 8 can be done.

II. Tip Growth Versus Base Growth of CNT Using Metal-Containing Nanoparticles.

The method of the invention provides a method to grow CNTs 5 having either tip growth or base growth using metal-containing nanoparticles, e.g. pure metal nanoparticles or metal-silicide nanoparticles, as catalyst.

Using metal-silicide nanoparticles 4 formed on a Si substrate 1 without a barrier layer 2, tip growth only takes place at low temperatures since the nanoparticles 4 do, in that case, not adhere in to the Si substrate 1. The temperature which can be used is further dependent on the thickness of the deposited thin metal film 3 and is preferably around 600° C. To have base growth, increasing anneal and/or CNT growth temperatures are required which not only modifies the as-grown CNT density and morphology, but also the growth mechanism. Due to the higher temperatures, catalytic nanoparticles 4 become partially embedded in the Si substrate 1 remaining anchored during CNT growth, thus promoting the so-called base growth mechanism; where the catalytic metal-silicide nanoparticles 4 remain at the substrate end of each CNT 5. Said catalytic nanoparticles 4 experience a competition process between catalysis and agglomeration/diffusion. On one hand, they decompose the carbon source to nucleate CNT 5. On the other hand, they start agglomerating and diffusing into the Si substrate 1. Only a few nanoparticles 4, in which CNT nucleation occurs before complete diffusion/agglomeration, can catalyze growth. Once this stage is passed, equilibrium is reached and CNTs 5 continue growing anchored to the substrate 1. The base growth mechanism is thus a consequence of the interaction between the catalyst nanoparticles 4 and the substrate 1. Preferably said temperature to obtain base growth may be lower than 700° C. such that still CNT nucleation and growth is possible. Higher temperatures tend to give rise to very poor CNT growth and the metal-silicide nanoparticles 4 tend to diffuse completely into the silicon substrate 1.

Using metal-silicide nanoparticles 4 formed on a barrier layer 2 (e.g. $SiO_2$), tip growth of CNT will be obtained. Using pure metal nanoparticles 6 formed on a barrier layer 2 (e.g. $SiO_2$), tip growth of CNT will be obtained.

III. CNT Growth on Metal-Containing Nanoparticles for Semi-Conductor Applications The method of the present invention for growing CNTs 5 based on the method of the disclosed invention will be described for semi-conductor applications. Some examples of processing methods to be used for semiconductor applications are illustrated in FIGS. 5A to 5E and in FIGS. 6A to 6H. It will be appreciated that there are numerous variations and modifications possible on these processing methods. Accordingly, the applications should not be deemed limited to the processing methods illustrated below.

Figure 5A:
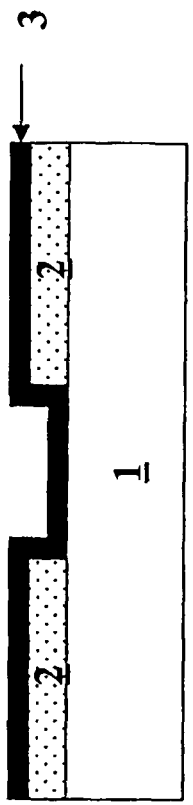
FIGS. 5A to 5D illustrate the processing method for growing CNT in a patterned structure by forming metal-silicide containing nanoparticles (e.g. Ni-Silicide particles) in said patterned structure.
Figure 5C:
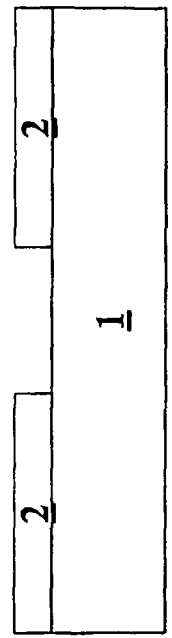
Figure 5B:
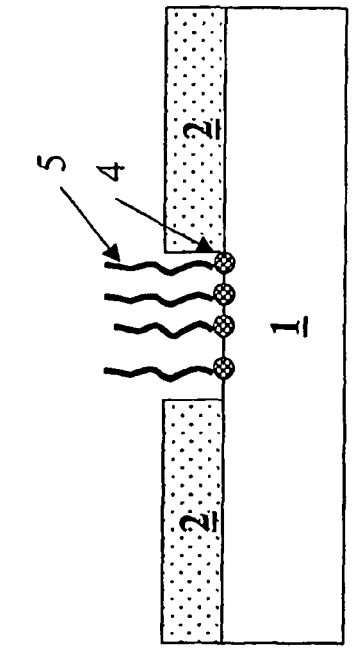
Figure 5D:
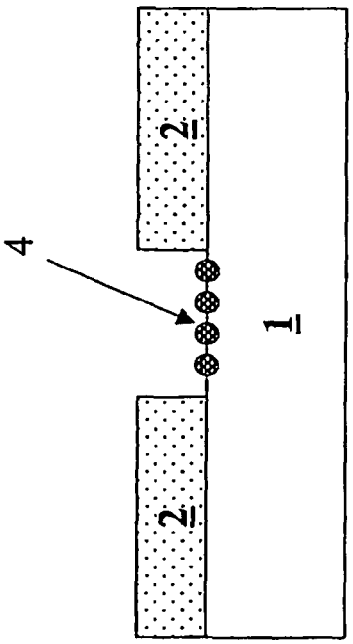
Figure 6A:
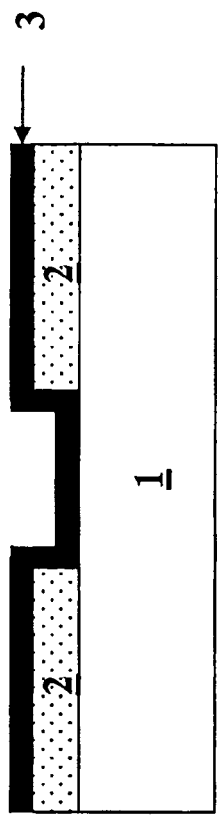
Figure 6B:
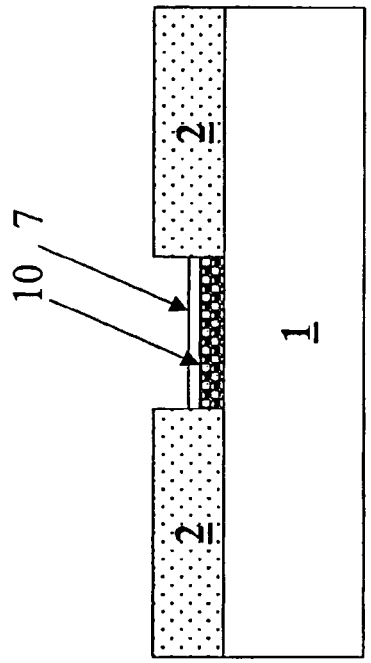
Figure 6C:
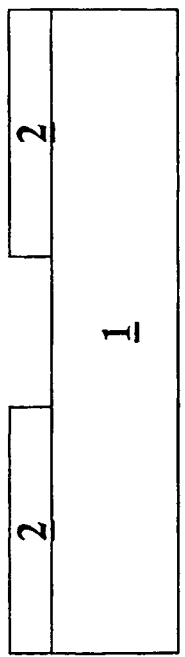
Figure 6D:
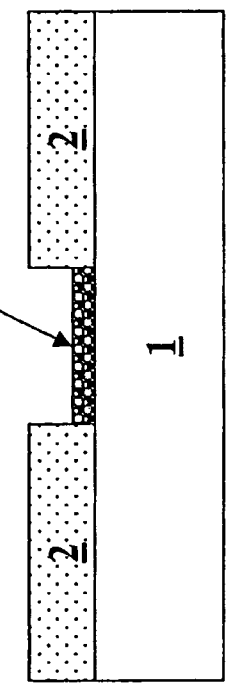

FIGS. 5A to 5E illustrate the processing method for forming metal-silicide nanoparticles 4 in a patterned structure. Preferably the starting substrate is a Si-substrate 1 with a barrier layer 2 deposited onto said Si substrate 1, said deposited barrier layer 2 can be e.g. $SiO_2$, but can also be a metal nitride such as HfN, TaN or TiN. The $SiO_2$ layer 2 may then be patterned, e.g. by dry-etching processes, such that part of the Si-substrate 1 is made free (see FIG. 5A). A thin metal film 3 is then deposited over the complete surface of the device as formed in the previous step (see FIG. 5B). Said thin film 3 can be deposited by common used sputter techniques such as PVD and the obtained metal film will then be a conformal metal film 3 as shown schematically in FIG. 5B. Said metal film 3 is preferably less than 10 nm thick and more preferably between 1 nm and 5 nm thick, and can comprise all suitable silicide forming metals such as Co, Fe, Ni, etc. Said thin metal layer 3 can also be a non-uniform sub-atomic layer deposited by e.g. ALD (Atomic Layer Deposition). Subsequently, an anneal step is performed to form metal-silicide containing nanoparticles 4 at the position of the part of the silicon substrate 1 that is not covered by the barrier layer 2. At positions where the $SiO_2$ barrier 2 was still present, pure metal particles 6 may be formed (not shown). These pure metal particles 6 may be removed by means of a chemical etch step. FIG. 5C illustrates the formation of metal-silicide nanoparticles 4 with a well controlled diameter and present in the patterned structure. To control the size, more particularly the diameter of said nanoparticles 4, the temperature and time duration of the anneal step are critical as described in detail in previous section and as shown in FIG. 7A. FIG. 5D illustrates the growth of CNTs 5 on said metal-silicide nanoparticles 4 (as described in previous embodiment). The formation and growth of CNTs 5 can be bottom up or top down or in other words can have the catalyst nanoparticle 4 attached to the substrate 1 or can have the catalyst nanoparticle 4 attached to top of the CNT 5. In an alternative also preferred embodiment, an intermediate continuous metal-silicide layer (e.g. a Co-silicide layer) 10 is first formed on the bottom (Si-surface) of the structure as shown in FIG. 6A to 6C. First, a barrier layer 2 may be deposited on top of a silicon substrate 1. The barrier layer 2 may then subsequently be patterned (see FIG. 6A). Next, a first metal layer 3 may be deposited on top of the structure as obtained in FIG. 6A (see FIG. 6B). In a next step, the structure may be annealed in order to form a metal-silicide layer 10 at the position where the substrate 1 is not covered by the barrier layer 2 (see FIG. 6C). The processing conditions to obtain a continuous metal-silicide layer 10 are shown in FIG. 7A and are preferably at temperatures lower than 500° C. The remaining parts of non-reacted metal or formed metal nanoparticles 6 (not shown) present on the barrier layer 2, e.g. $SiO_2$ layer, may be removed by means of wet etching. Onto said continuous layer 10 of metal-silicide, a thin layer of Si (see FIG. 6D) and subsequently a second thin metal layer 12 may be deposited (see FIG. 6E). Preferably, the thin layer of Si 7 may have a thickness of between 1 nm and 10 nm and may preferably be around 5 nm. Preferably, the second metal used for the second thin metal layer 12 may be a metal forming metal-silicide nanoparticles 4 at lower temperatures compared with the metal of the first applied metal layer 3. Subsequently an anneal step is performed to form metal-silicide containing nanoparticles 4. The remaining, non-reacted metal film situated on $SiO_2$ surfaces or pure metal particles may be removed by means of a chemical etch step. FIG. 6F illustrates the final structure with metal-silicide nanoparticles 4 with well controlled diameter on a metal-silicide layer 10 within a patterned structure. CNTs 5 can then be grown as described before (using top-down or bottom up approach) (see FIG. 6G in which top down growth is illustrated, i.e. the CNT 5 is attached to the silicide layer 10 on the substrate 1 and the metal-silicide nanoparticle 4 is located on top of the CNT 5).

Figures 14A, 14B, 14C, 14D:
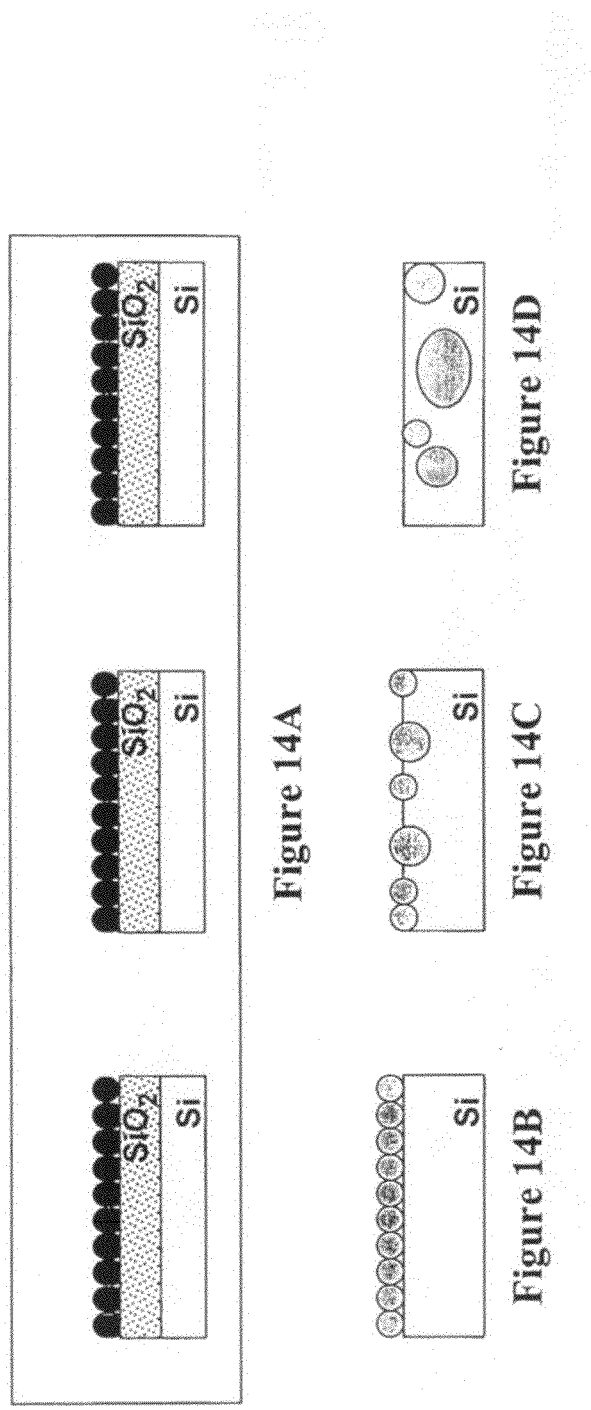
FIGS. 14A up to 14D illustrate schematics of pure metal nanoparticles formed on a $SiO_2$ barrier layer (FIG. 14A) and metal-silicide nanoparticles formed on a (pristine) Si substrate (FIG. 14B). Changes in topography, and consequent loss of catalytic activity of the metal-silicide nanoparticles, are due to sintering (as shown in FIG. 14C) and/or diffusion (FIG. 14D) as a function of pretreatment annealing and/or CNT growth.

FIGS. 14A up to 14D illustrate schematics of pure metal nanoparticles formed on a $SiO_2$ barrier layer (FIG. 14A) and metal-silicide nanoparticles formed on a (pristine) Si substrate (FIG. 14B). Changes in topography, and consequent loosing of catalytic activity of the metal-silicide nanoparticles, are due to sintering (as shown in FIG. 14C) and/or diffusion (FIG. 14D) as a function of pretreatment annealing and/or CNT growth.

EXAMPLES

Example 1

Formation of Metal Nanoparticles Versus Formation of Metal-Silicide Nanoparticles on a Silicon Substrate Two different substrates were evaluated. The first substrate is a pure Si (100) wafer, the second substrate is a Si (100) wafer with a 50 nm thermal oxide grown on it (in this disclosure referred to as $SiO_2$ surface). Co. Ni or Fe metal films were deposited on said substrates (sputter process) to obtain a 1 nm and 5 nm thin metal film. These substrates comprising the metal films were then annealed in different gas ambients ($N_2$, $H_2$ or 50% $N_2$/50% $H_2$) at 600° C. After annealing (as described by the method of this invention) the continuous metal film is transformed into nanoparticles. The temperature of the annealing process to obtain metal-silicide particles turned out to be very important. FIG. 7 illustrates the optimal annealing temperatures for achieving metal-silicide nanoparticles on a Si-substrate for a 1 nm deposited Ni film, a 5 nm deposited Ni film, a 1 nm deposited Co film and a 5 nm deposited Co film.

The temperature used to form nanoparticles as well as the temperature to initiate CNT growth is a key factor to control the catalytic activity of metal-silicides when Si is used as a substrate, in case no barrier layer is used. A too low temperature will result in a continuous metal-silicide containing film which will not give rise to CNT growth. A too high temperature will result in agglomeration and/or embedding of the metal-silicide particles into the Si substrate which has to be avoided. Only in a narrow temperature window (as summarized in FIG. 7A) metal-silicide nanoparticles are formed which are catalytically active and will lead to massive CNT growth. Table 1 below summarizes the changes in composition and morphology and related impact on CNT growth due to the temperature setting for a metal film deposited on a Si substrate or a $SiO_2$ substrate.

TABLE 1

Summary of changes in composition and morphology of metal-silicides formed on a silicon substrate due to the applied temperature during anneal and/or growth process and their related impact on CNT growth.

| SUBSTRATE | COMPOSITION/TOPOGRAPHY | | TEMPERATURE | CNT GROWTH |
|---|---|---|---|---|
| Si | Metal-silicides | nanoparticles | Optimal | MASSIVE GROWTH |
| | | Embedded nanaparticles | Too high | POOR GROWTH |
| | | Continuous film | Too low | NO GROWTH |
| $SiO_2$ | Metal-nanoparticles | | Pure metal nanoparticles | MASSIVE GROWTH |

Figure 8A:
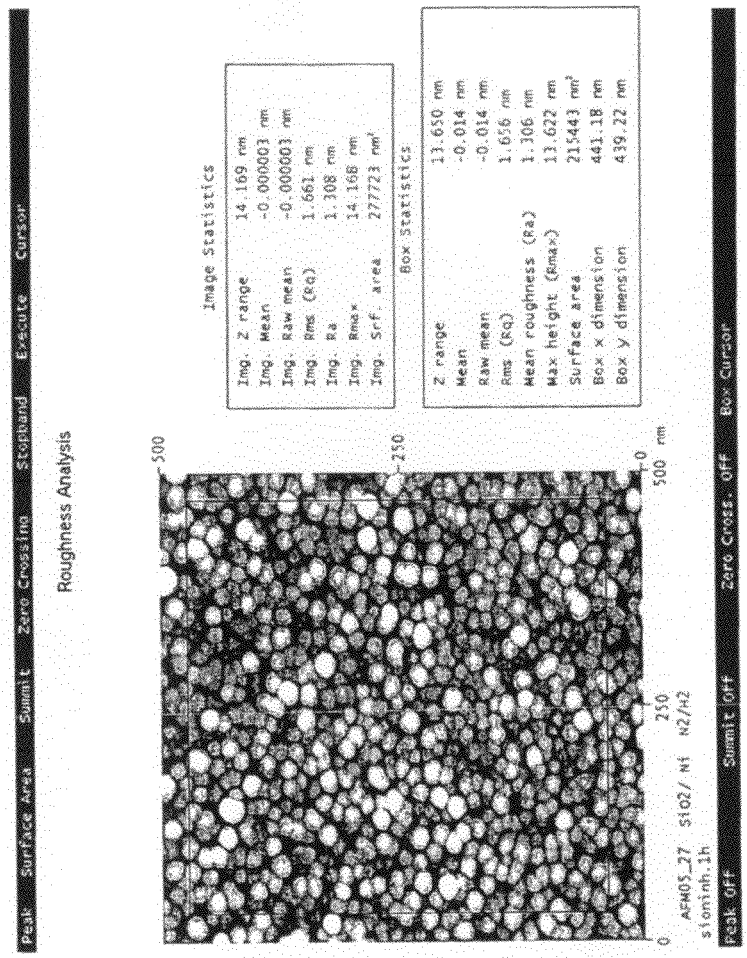
FIG. 8A to 8D show AFM (Atomic Force Microscopy) roughness analysis results after annealing a thin metal film (Ni and Co) on a Si and $SiO_2$ surface resulting in metal nanoparticles in case of a $SiO_2$ surface (as seen in FIGS. 8A and 8B) and in metal-silicide nanoparticles in case of a Si surface (as seen in FIGS. 8C and 8D).
Figure 8B:
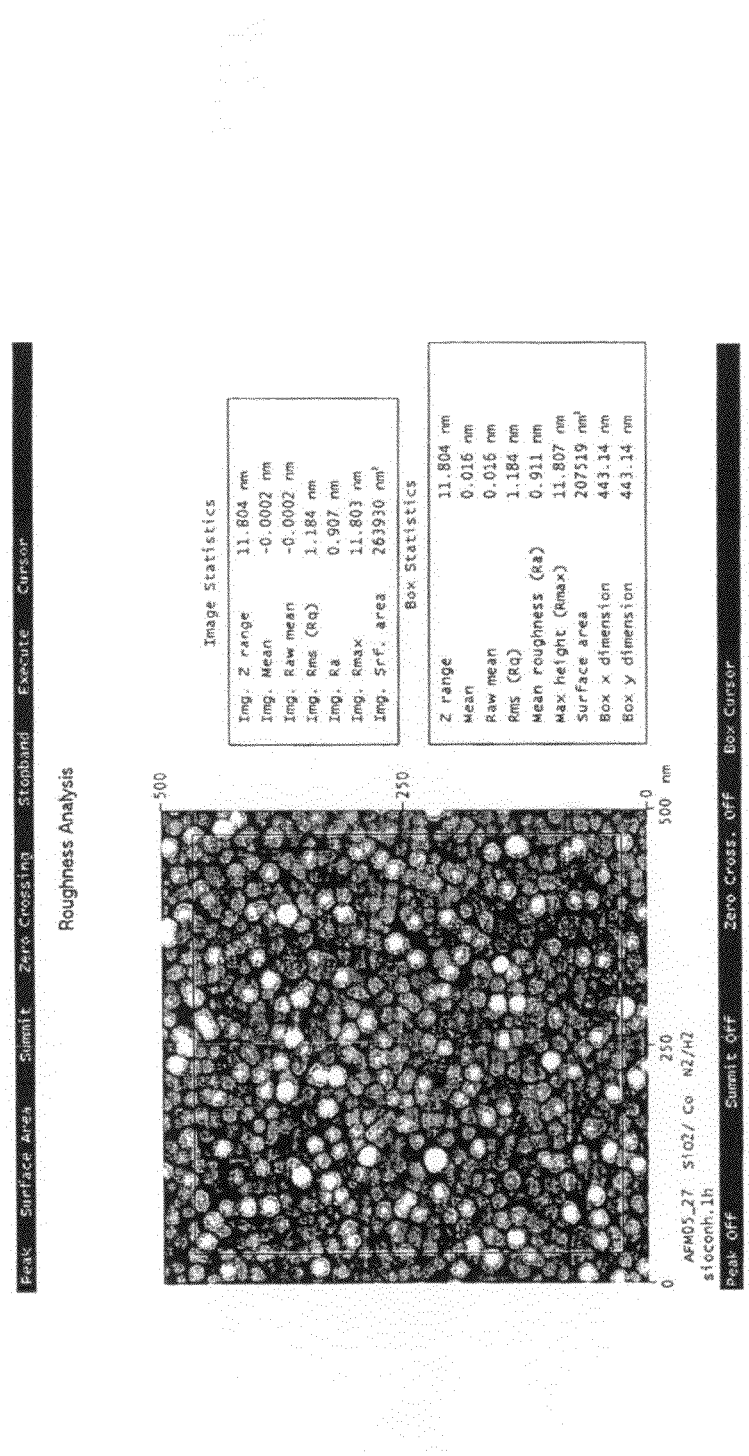
Figure 8C:
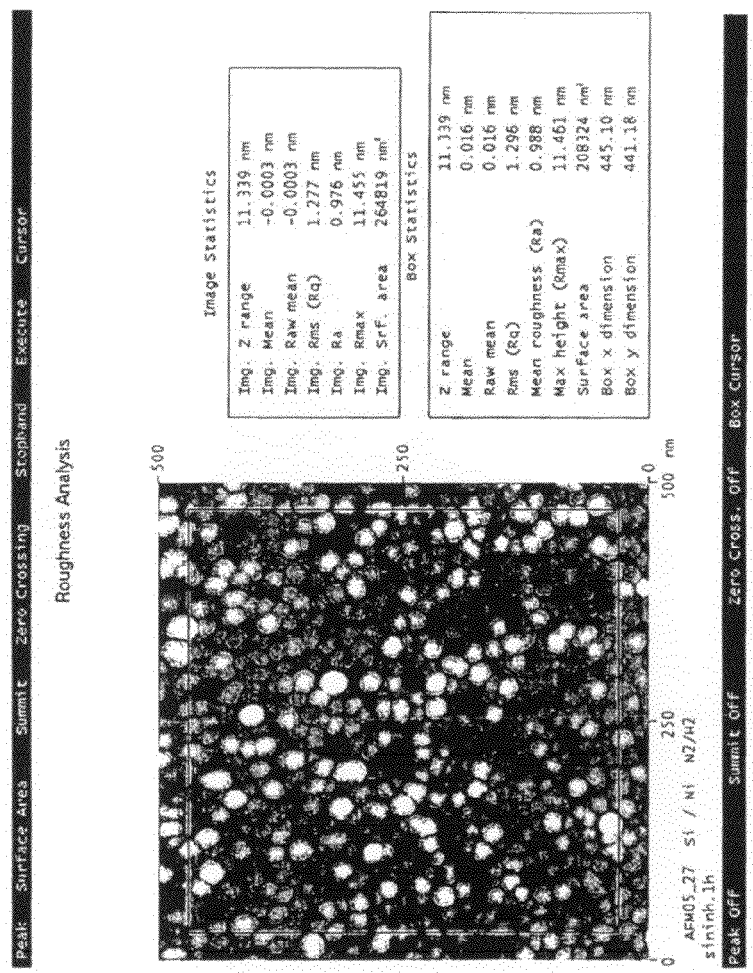
Figure 8D:
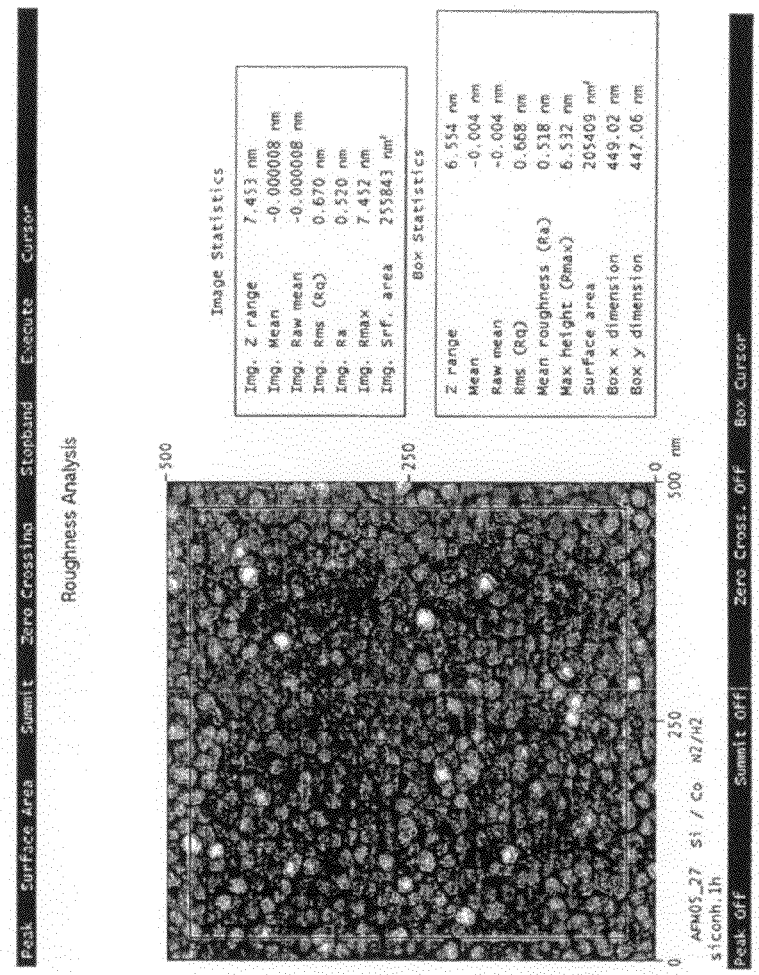

FIG. 8A to 8D shows AFM (Atomic Force Microscopy) roughness analysis results after annealing the thin metal film (in the examples given Ni and Co) on said Si and $SiO_2$ surface resulting in metal nanoparticles in case of a $SiO_2$ surface (as seen in FIG. 8A for Ni and 8B for Co) and in metal-silicide nanoparticles in case of a Si surface (as seen in FIG. 8C for Ni and 8D for Co). In case of metal-silicide nanoparticles the results show that these particles have become slightly embedded into the substrate. However, the nanoparticles are mainly protruding from the surface. The particle size distribution can be well controlled which has an impact on the CNT diameter dispersion. The metallic dispersion, which is a measurement of the density of the active phase is related to the CNT yield. The higher the metallic dispersion is, the higher the CNT yield will be.

Figure 9A:
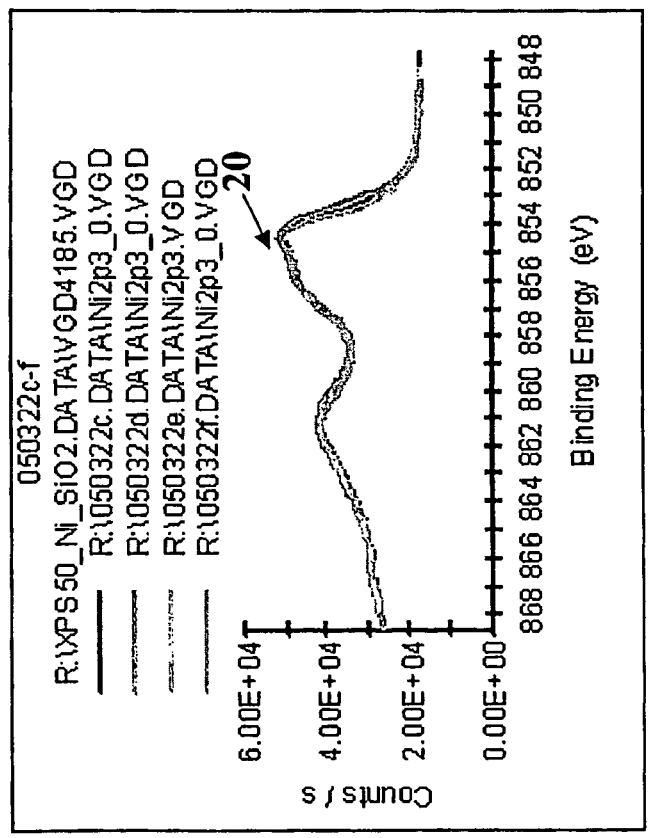
FIG. 9A to 9B show XPS (X-Ray Photoelectron Spectroscopy) analysis results after annealing (at 600° C. for 1 minute at atmospheric pressure and in N2 environment) a thin metal film on a $SiO_2$ surface showing clearly that only pure metal nanoparticles were obtained and no silicidation occurred.
Figure 9B:
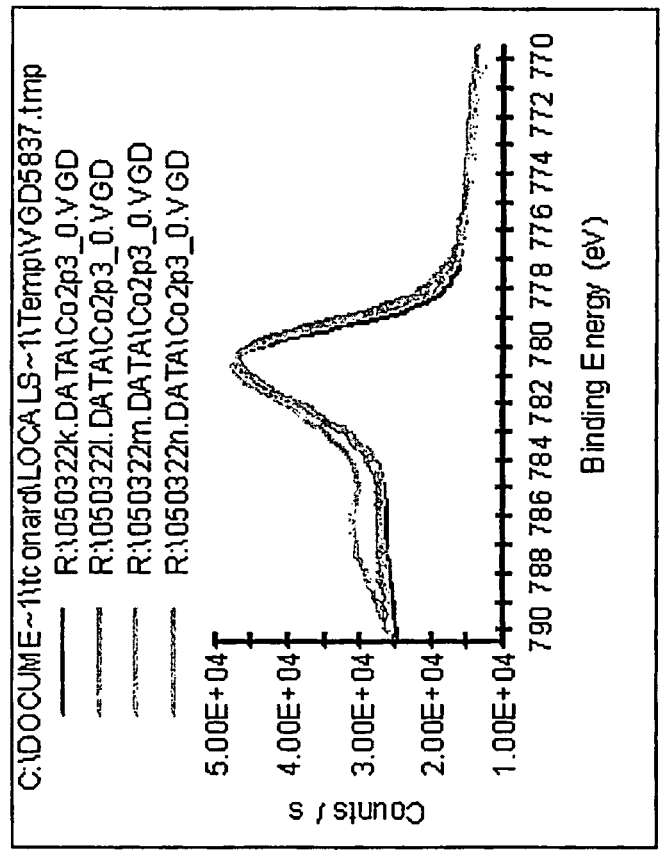

FIG. 9A to 9B show XPS (X-Ray Photoelectron Spectroscopy) analysis results after annealing (at 600° C. for 1 minute at atmospheric pressure and in $N_2$ environment) a thin metal film (thicknesses from 1 nm up to 10 nm) on a 50 nm $SiO_2$ barrier layer. The XPS results show clearly that only pure metal nanoparticles are obtained and no silicidation occurred on a $SiO_2$ barrier layer, no changes are observed in the Si photo-emission and only a pure $SiO_2$ peak is present. The Figures show also that there is no difference observed in film thickness (no effect). FIG. 9A shows the XPS spectra of a thin Ni film (4 samples are involved, one with a thickness of 1 nm, one with a thickness of 5 nm and two with a thickness of 10 nm, which give substantially the same results) deposited on a $SiO_2$ barrier layer, the Ni 2p line exhibits the expected doublet structure. The low binding energy peak (indicated by reference number 20) is clearly composed of at least two components giving rise to maxima at ~854.5 and 856.1 eV typical of NiO and $Ni_2O_3$, respectively. It should be mentioned that samples were exposed to air after annealing explaining the oxidation of the metal particles. The absence of a Ni silicide peak expected at 852.6 eV means that silicidation can be excluded. FIG. 9B shows the XPS spectra of a thin Co film (4 samples are involved, one with a thickness of 1 nm, one with a thickness of 5 nm and two with a thickness of 10 nm, which give substantially the same results) deposited on a $SiO_2$ barrier layer and also here no changes are observed in the Co 2p3/2 line shape for the Co film before and after annealing, with the exception of the appearance of a shoulder on the low binding energy side of the Co 2p3/2 peak for the 10 nm thickness attributed to sample charging. Again, silicidation can also be excluded in the case of Co as evidenced by the absence of a silicide peak expected at ~778 eV.

Figure 10A:
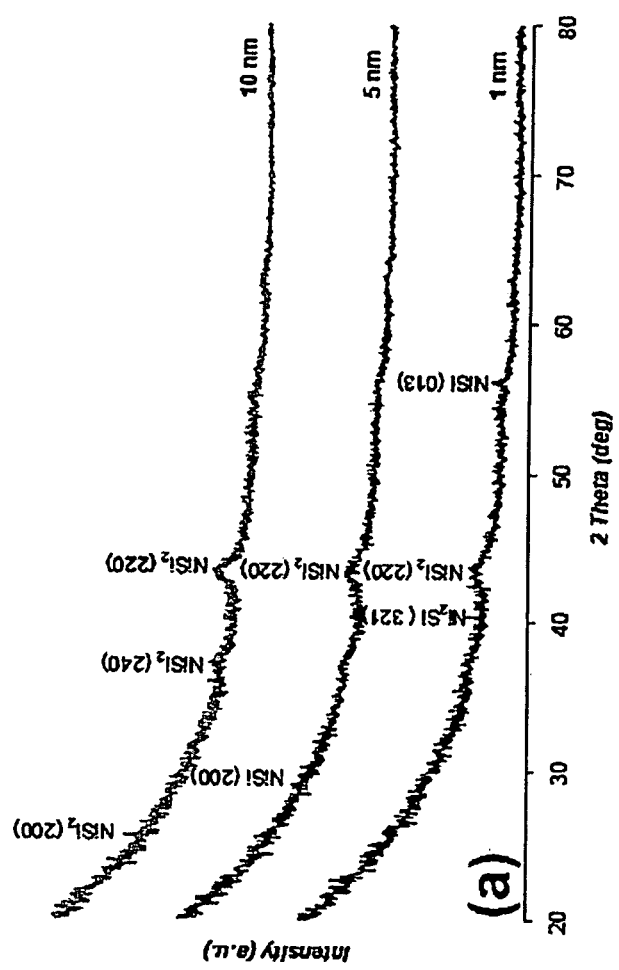
FIG. 10A to 10B are XRD spectra illustrating that a pure metal film on a Si(100) surface is transformed in metal-silicide particles and no pure metal nanoparticles are formed. Said substrates were annealed in three different ambients, i.e. in pure $N_2$, 50% $N_2$/50% $H_2$ and pure $H_2$, at 600° C.
Figure 10B:
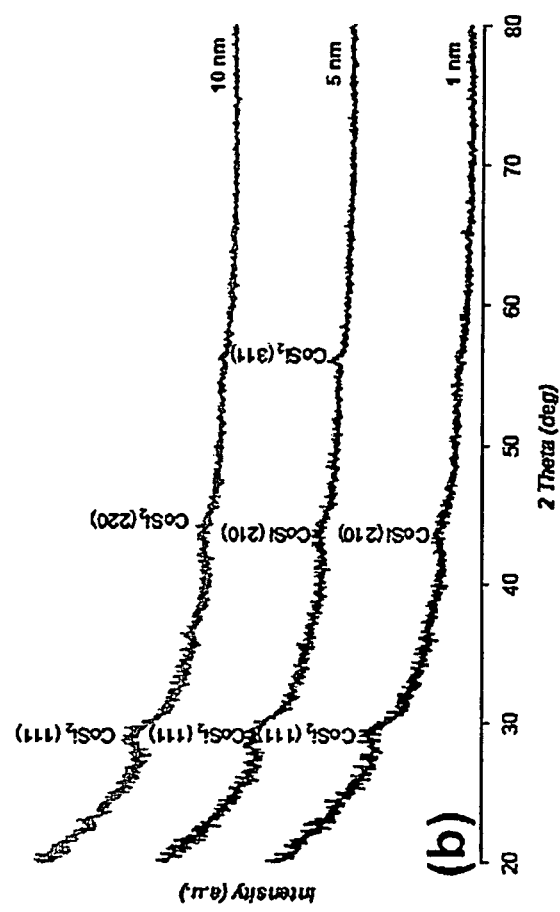
Figure 11A:
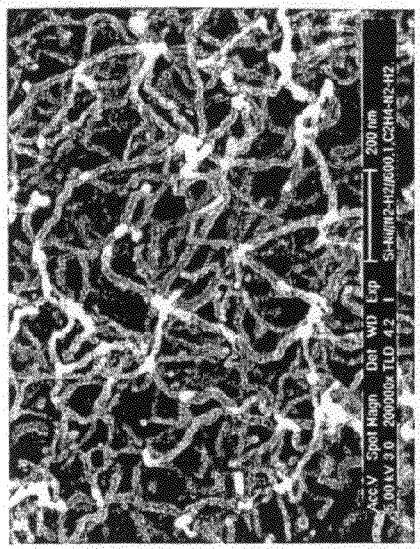
FIG. 11A to 11D show SEM (Scanning Electron Microscopy) pictures after growth of CNT on a $SiO_2$ surface with metal nanoparticles as catalysts (FIG. 11A for Co nanoparticles and FIG. 11B for Ni nanoparticles as catalyst) and on a Si surface with formation of metal-silicide nanoparticles as catalysts (FIG. 11C for Ni-silicide nanoparticles and FIG. 11D for Co-silicide nanoparticles as catalyst). There is no difference found in the efficiency of the CNT growth.
Figure 11B:
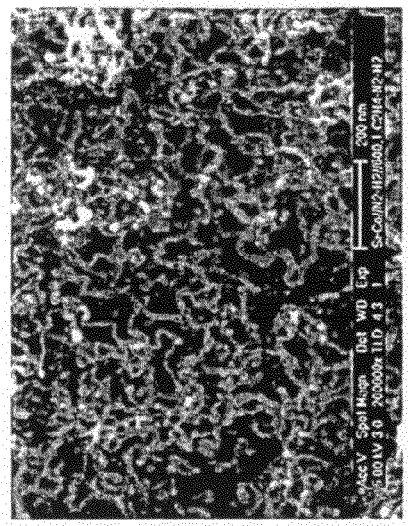
Figure 11C:
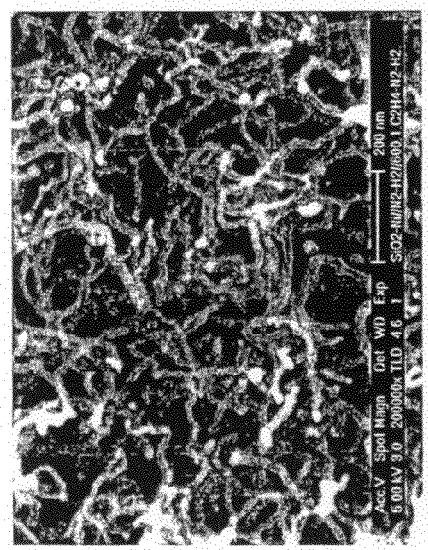
Figure 11D:
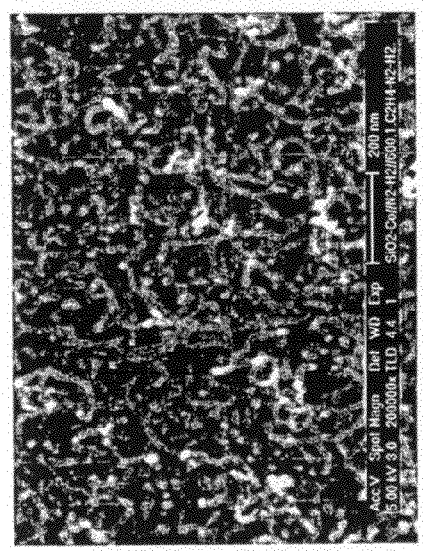
Figure 13B:
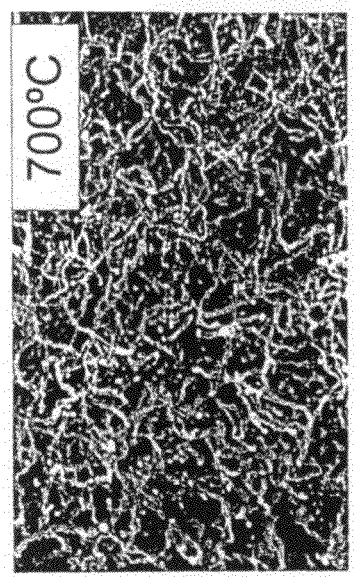
FIG. 13A to 13D illustrate the massive growth of CNT on Ni-silicide nanoparticles formed on a $SiO_2$ barrier layer at temperatures of 600° C. up to 900° C.
Figure 13D:
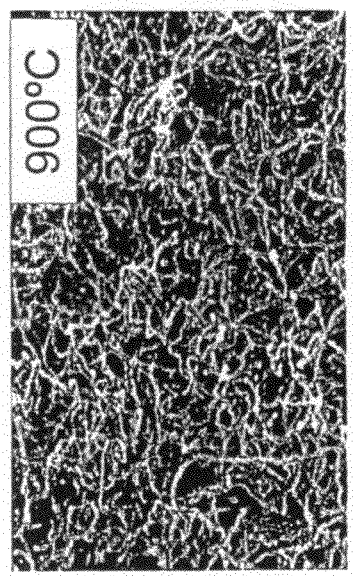
Figure 13A:
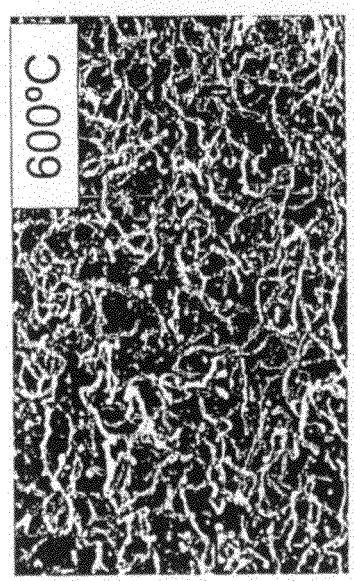
Figure 13C:
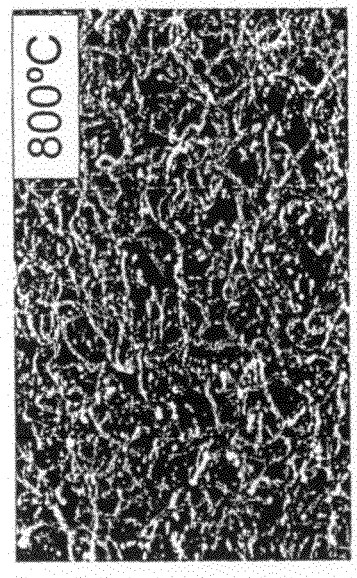

FIGS. 10A and 10B are XRD spectra illustrating that a (pure) metal film on a Si(100) surface is transformed in metal-silicide (nanoparticles) and no pure metal nanoparticles are formed. For these experiments, the substrates are annealed in three different ambients: pure $N_2$, 50% $N_2$/50% $H_2$ and pure $H_2$) at 600° C. FIG. 10A illustrates this in the case of Ni while FIG. 10B illustrates this in the case of Co. The peaks present at respectively 43 degrees (FIG. 10A) and 28 degrees (FIG. 10B) illustrate the presence of metal-silicide. The XRD patterns show predominantly peaks for $NiSi_2$ and $CoSi_2$ and also several peaks for NiSi and CoSi, but with lower intensity, which indicates the expected transformation of the film 3 into metal silicide.

Example 2

Comparison of Growth of CNT on Metal Nanoparticles Versus CNT Growth on Metal-Silicide Nanoparticles Substrates as described in example 1, comprising metal nanoparticles or metal-silicide nanoparticles were exposed to CNT synthesis conditions comprising $C_2H_4$ as carbon source, $N_2$ and $H_2$ as assistant gases. Growth was performed at 600° C. The resulting CNTs were characterized by high-resolution microscopy. The findings of this study reveal that metal films such as Fe, Co and Ni films form nanoparticles that are catalytically active for CNT synthesis on both Si and $SiO_2$ surfaces depending on the pretreatment and synthesis conditions. This implies that metal-silicide formation does not inhibit CNT growth as mentioned in prior art references but instead results in comparable CNT yield when the method for forming metal-silicide nanoparticles of the current invention is used. Overall, these results indicate that the considerable expertise already existing in metal silicides can be applied and extended for the future integration of CNT.

FIG. 11A to 11D show SEM (Scanning. Electron Microscopy) pictures after growth of CNT on a SiO$_2$ surface with metal nanoparticles as catalysts (FIG. 11A for Ni nanoparticles and FIG. 11B for Co nanoparticles as catalyst) and on a Si surface with formation of metal-silicide nanoparticles as catalysts (FIG. 11C for Ni-silicide nanoparticles and FIG. 11D for Co-silicide nanoparticles as catalyst). There is no difference found in the efficiency of the CNT growth. The obtained CNTs are uniform in diameter and it can be concluded that the size of the metal-silicide containing nanoparticle used as catalyst in the CNT growth process is very critical to achieve such uniform CNT growth.

FIG. 12 shows TEM (Transmission Electron Microscopy) images of grown CNT on Ni nanoparticles on a SiO$_2$ substrate (FIG. 12A), on Co nanoparticles on a SiO$_2$ substrate (FIG. 12B), Ni-silicide nanoparticles on a Si substrate (FIG. 12C) and on Co-silicide nanoparticles on a Si substrate (FIG. 12D).

Example 3

Catalytic Activity of Metal-Silicide Nanoparticles Using a Diffusion Barrier Layer to Avoid Migration of Silicides into the Substrate Metal-silicides formed on a silicon substrate can only be used as catalyst for CNT growth in a narrow process window since the temperature has to be limited to avoid growth inhibition. The decomposition temperature of the selected carbon source has to be lower that the growth temperature, otherwise the metal-silicide nanoparticles agglomerate or become embedded in the substrate before CNT growth occurs. It would mean that if Si is replaced by another substrate where agglomeration/diffusion of metal silicide nanoparticles is avoided, these compounds should be in principle active at higher temperatures.

To prove this assumption, a sample was prepared comprising metal-silicide nanoparticles which were formed on a barrier layer (SiO$_2$). To achieve this, 5 nm of poly-Si, followed by 5 nm Ni were deposited onto 100 nm of thermal oxide (SiO$_2$). The samples were then exposed to various growth temperatures. The samples were annealed at 600° C. for 1 min which transformed the poly-Si and Ni layer into nanoparticles whose composition were mainly nickel mono-silicide (as confirmed by AFM and XPS, respectively). Subsequently, these samples were evaluated for CNT growth at temperatures ranging between 600° C. and 900° C. Massive growth was verified in all cases. FIG. 13A to 13D illustrate the massive growth of CNT on Ni-silicide nanoparticles at temperatures of 600° C. up to 900° C. Since metal nanoparticles cannot diffuse through the SiO$_2$ barrier, no topographical changes occurred. Hence, it is confirmed that nanoparticles remain active in the entire range of evaluated temperatures and CNT can grow even at 900° C. In addition, tip growth mechanism was verified in all cases, confirming that the effect of temperature for catalyst anchoring only takes place when Si is used as substrate.

Although in the prior art it is said to avoid the use of metal silicides for the growth of CNTs, the present invention has shown that by carefully tuning the parameters at which metal-silicide particles are formed as described in this invention, metal-silicide particles can be formed which are as catalytically active as pure metal catalyst particles. The use of metal-silicide particles can be advantageous in the manufacturing of, for example, semiconductor devices.

The invention claimed is:

1. A method for forming metal-silicide nanoparticles for use as catalysts in carbon nanotube growth, the method comprising:
   depositing a barrier layer on a substrate;
   depositing a thin layer of silicon containing material having a thickness of from 1 nm to 10 nm on the barrier layer;
   depositing a thin metal film onto the thin layer of silicon containing material, the thin metal film having a thickness of from 1 nm to 10 nm; and
   annealing the thin metal film and the thin layer of silicon containing material to form metal-silicide nanoparticles having a diameter smaller than 10 nm, wherein the barrier layer prevents diffusion of the metal-silicide nanoparticles into the substrate.

2. The method of claim 1, wherein annealing is performed at a temperature higher than 500° C. and lower than 900° C.

3. The method of claim 1, wherein the thin metal film has a thickness of from 1 nm to 5 nm.

4. The method of claim 1, wherein the substrate is a silicon wafer.

5. The method of claim 1, wherein the metal-silicide nanoparticles are selected from the group consisting of Ni-silicides, Co-silicides, and Fe-silicides nanoparticles.

6. The method of claim 1, wherein the barrier layer is a thermally grown SiO$_2$ layer with a thickness of from 50 nm to 100 nm.

7. The method of claim 1, wherein the barrier layer comprises at least one material selected from the group consisting of Si$_3$N$_4$, TaN, HfN, and TiN.

8. The method of claim 1, wherein the thin metal film is selected from the group consisting of a Co film, a Ni film, and a Fe film.

9. The method of claim 8, wherein the thin metal film is deposited by a sputter or deposition technique selected from the group consisting of physical vapor deposition, atomic layer deposition, and electrochemical deposition.

10. A method for growing carbon nanotubes on a substrate having metal-silicide nanoparticles thereon prepared according to the method of claim 1, the method comprising:
    growing carbon nanotubes using the metal-silicide nanoparticles as a catalyst.

11. Use of the method of claim 1 in the manufacturing of a semiconductor device.

12. The method of claim 1, wherein the thin metal layer is a uniformly deposited continuous thin metal layer.

13. The method of claim 1, wherein the thin metal layer is a non-uniform sub-atomic layer deposited by at least one technique selected from the group consisting of atomic layer deposition, electrodeposition, and electroless deposition.

14. The method of claim 1, wherein the thin layer of silicon containing material is consumed to form metal-silicide nanoparticles.

15. The method of claim 1, wherein the thin layer of silicon containing material has a thickness of from 1 nm to 5 nm.

16. The method of claim 1, wherein the metal-silicide nanoparticles are uniformly dispersed and situated on top of the barrier layer.

17. The method of claim 1, wherein the metal-silicide nanoparticles are situated on top of the barrier layer but are not embedded in or attached to the barrier layer.

18. The method of claim 1, wherein the silicon containing material is silicon.

19. The method of claim 18, wherein the silicon containing material is poly-Si.

20. A device comprising:
a substrate;
a barrier layer on the substrate, the barrier layer configured for preventing diffusion of metal-silicide nanoparticles into the substrate; and
uniformly dispersed metal-silicide nanoparticles situated on the barrier layer, but not embedded in or attached to the barrier layer, and having a diameter smaller than 10 nm.

* * * * *

UNITED STATES PATENT AND TRADEMARK OFFICE
CERTIFICATE OF CORRECTION

PATENT NO.        : 8,470,709 B2
APPLICATION NO.   : 11/993828
DATED             : June 25, 2013
INVENTOR(S)       : Esconjauregui et al.

Page 1 of 1

It is certified that error appears in the above-identified patent and that said Letters Patent is hereby corrected as shown below:

Title Page (item 73, Assignee) at line 2, Change "Universitet" to --Universiteit--.

In the Specification

In column 10 at line 25, After "CNTs" insert --5--.

In column 14 at line 21, After "Si" insert --7--.

In column 14 at line 60, Change "Co." to --Co,--.

Signed and Sealed this
Eleventh Day of March, 2014

Michelle K. Lee
*Deputy Director of the United States Patent and Trademark Office*